United States Patent
Jeon et al.

(10) Patent No.: US 10,692,578 B2
(45) Date of Patent: Jun. 23, 2020

(54) NONVOLATILE MEMORY DEVICE FOR PERFORMING URGENT READ OPERATION BASED ON SUSPEND COMMAND AND METHOD OF OPERATING THE SAME

(71) Applicant: Samsung Electronics Co., Ltd., Suwon-si, Gyeonggi-do (KR)

(72) Inventors: Su-chang Jeon, Seoul (KR); Kui-han Ko, Seoul (KR); Dong-hun Kwak, Hwaseong-si (KR); Jin-young Kim, Seoul (KR)

(73) Assignee: SAMSUNG ELECTRONICS CO., LTD, Gyeonggi-Do (KR)

( * ) Notice: Subject to any disclaimer, the term of this patent is extended or adjusted under 35 U.S.C. 154(b) by 0 days.

(21) Appl. No.: 15/955,029

(22) Filed: Apr. 17, 2018

(65) Prior Publication Data
US 2019/0057742 A1 Feb. 21, 2019

(30) Foreign Application Priority Data

Aug. 17, 2017 (KR) .................. 10-2017-0104140

(51) Int. Cl.
| | |
|---|---|
| *G11C 16/10* | (2006.01) |
| *G11C 16/26* | (2006.01) |
| *G11C 16/34* | (2006.01) |
| *G06F 13/00* | (2006.01) |
| *G06F 13/16* | (2006.01) |
| *G11C 16/30* | (2006.01) |
| *G11C 16/32* | (2006.01) |

(Continued)

(52) U.S. Cl.
CPC .............. *G11C 16/10* (2013.01); *G06F 13/00* (2013.01); *G06F 13/1642* (2013.01); *G11C 16/26* (2013.01); *G11C 16/30* (2013.01); *G11C 16/3459* (2013.01); *G11C 5/148* (2013.01); *G11C 7/1045* (2013.01); *G11C 11/5671* (2013.01); *G11C 16/0466* (2013.01); *G11C 16/0483* (2013.01); *G11C 16/32* (2013.01); *H01L 27/11582* (2013.01)

(58) Field of Classification Search
CPC ..... G11C 16/10; G11C 16/3459; G11C 16/30; G11C 16/26; G11C 16/0483; G11C 16/0466; G11C 16/32; G11C 5/148; G11C 7/1045; G11C 11/5671; G06F 13/1642; G06F 13/00; H01L 27/11582
See application file for complete search history.

(56) References Cited

U.S. PATENT DOCUMENTS

| | | |
|---|---|---|
| 6,930,925 B2 | 8/2005 | Guo et al. |
| 7,679,133 B2 | 3/2010 | Son et al. |

(Continued)

*Primary Examiner* — Sultana Begum
(74) *Attorney, Agent, or Firm* — Harness, Dickey & Pierce, P.L.C

(57) ABSTRACT

Provided is a method performed by a nonvolatile memory device, the method may include: initiating a first program operation corresponding to a first program loop among a plurality of program loops; receiving a suspend command for an urgent read operation during the first program operation; determining a recovery timing from either of a first timing contemporaneous with the receiving the suspend command, and a second timing after completion of the first program operation, based on the suspend command; and initiating a recovery at the determined recovery timing by applying a recovery voltage to a selected word line.

20 Claims, 19 Drawing Sheets

(51) Int. Cl.
  *G11C 11/56* (2006.01)
  *H01L 27/11582* (2017.01)
  *G11C 16/04* (2006.01)
  *G11C 7/10* (2006.01)
  *G11C 5/14* (2006.01)

(56) References Cited

U.S. PATENT DOCUMENTS

| | | |
|---|---|---|
| 8,488,381 B2 | 7/2013 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,021,158 B2 | 4/2015 | Hyun et al. |
| 9,223,514 B2 | 12/2015 | Hyun et al. |
| 9,293,206 B2 | 3/2016 | Nam |
| 9,558,837 B2 | 1/2017 | Harada et al. |
| 2011/0233648 A1 | 9/2011 | Seol et al. |
| 2012/0044764 A1* | 2/2012 | Nakai .................. G11C 16/14 365/185.11 |
| 2012/0179860 A1 | 7/2012 | Falanga et al. |
| 2014/0334232 A1 | 11/2014 | Nam et al. |
| 2015/0186042 A1 | 7/2015 | Lee |
| 2016/0313946 A1 | 10/2016 | Zang et al. |
| 2018/0024774 A1* | 1/2018 | Shin .................. G06F 13/1673 711/154 |
| 2018/0247695 A1* | 8/2018 | Kasai ................ G11C 16/3459 |

* cited by examiner

NONVOLATILE MEMORY DEVICE FOR PERFORMING URGENT READ OPERATION BASED ON SUSPEND COMMAND AND METHOD OF OPERATING THE SAME

CROSS-REFERENCE TO RELATED APPLICATION

This application claims 35 U.S.C. § 119 to Korean Patent Application No. 10-2017-0104140, filed on Aug. 17, 2017, in the Korean Intellectual Property Office, the disclosure of which is incorporated herein in its entirety by reference.

BACKGROUND

Some example embodiments relate to a memory device, and more particularly, to a nonvolatile memory device performing an urgent read request during a program operation.

Semiconductor memory devices are memory devices realized by using semiconductors such as silicon (Si), germanium (Ge), gallium arsenide (GaAs), and indium phosphide (InP). Semiconductor memory devices are generally classified into volatile semiconductor memory devices and nonvolatile semiconductor memory devices.

Nonvolatile memory devices are memory devices in which data stored therein does not disappear even with a cut-off of power supply. Nonvolatile memory devices may include read-only memories (ROMs), programmable ROMs (PROMs), erasable PROMs (EPROMs), electrically EPROMs (EEPROMs), flash memory devices, phase-change random-access memories (RAMs) (PRAMs), magneto-resistive RAMs (MRAMs), and ferroelectric RAMs (FRAMs). Flash memory devices may be largely classified into a NOR-type and a NAND-type.

SUMMARY

Some example embodiments provide a nonvolatile memory device that efficiently performs an urgent read request received during a program operation and a method of operating the nonvolatile memory device.

According to some example embodiments, there is provided a method performed by a nonvolatile memory device. The method includes initiating a first program operation corresponding to a first program loop among a plurality of program loops. The method further includes receiving a suspend command for an urgent read operation during the first program operation. The method further includes determining a recovery timing from either of a first timing contemporaneous with the receiving the suspend command, and a second timing after completion of the first program operation, based on the suspend command. Furthermore, the method includes initiating a recovery at the determined recovery timing by applying a recovery voltage to a selected word line.

According to some example embodiments, there is provided a method performed by a nonvolatile memory device. The method includes increasing a voltage level of a selected word line by sequentially applying a plurality of stepwise increasing supply voltages to the selected word line corresponding to a program command. The method further includes receiving a suspend command for an urgent read operation during the increasing. The method further includes determining a recovery mode in response to a recovery timing based on the suspend command. Furthermore, the method includes performing a recovery according to the determined recovery mode; and performing the urgent read operation in response to a read command, wherein the recovery mode is either of a cancel mode in which the recovery is performed contemporaneous with the receiving the suspend command and a loop mode in which the recovery is performed after increasing the voltage level of the selected word line to a target voltage.

According to some example embodiments, there is provided a nonvolatile memory device including at least one processor executing computer-readable instructions stored in non-transitory computer readable storage configured to apply a program voltage to a selected word line for increasing a voltage level of the selected word line to perform a program operation in response to a program command, apply a recovery voltage to the selected word line according to a recovery mode in response to receiving a suspend command for an urgent read operation during the program operation, and determine the recovery mode based on the received suspend command, wherein the recovery mode is either of a cancel mode in which the recovery voltage is applied before a first program loop corresponding to the program command is complete, and a loop mode in which the recovery voltage is applied after the first program loop is complete.

BRIEF DESCRIPTION OF THE DRAWINGS

Some example embodiments will be more clearly understood from the following detailed description taken in conjunction with the accompanying drawings in which.

DETAILED DESCRIPTION

Figure 1:
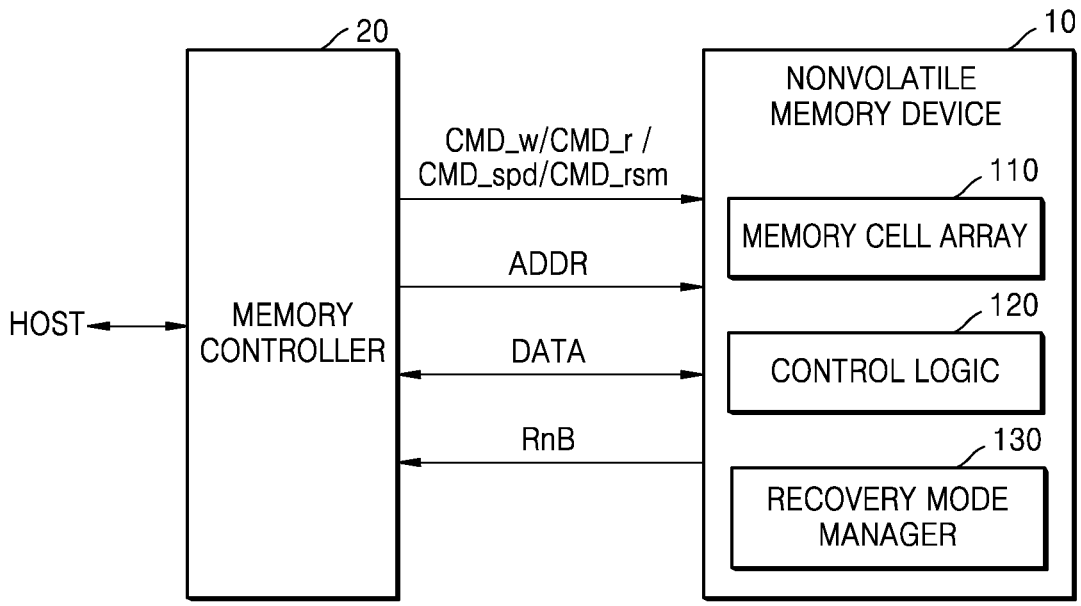
FIG. 1 is a block diagram illustrating a nonvolatile memory system according to some example embodiments.

FIG. 1 is a block diagram illustrating a nonvolatile memory system 1 according to some example embodiments.

Referring to FIG. 1, the nonvolatile memory system 1 may be provided as within a computing system such as a workstation, a netbook, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a digital audio recorder, a digital picture recorder, a digital picture player, a digital video recorder, and a digital video player.

The nonvolatile memory system 1 may include a memory controller 20 and a nonvolatile memory device 10. In some example embodiments, each of a host HOST, the memory controller 20, and the nonvolatile memory device 10 may be provided as one chip, one package, one module, or the like. Alternatively, the memory controller 20 and the nonvolatile memory device 10 may be mounted in packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), and wafer-level processed stack package (WSP).

The memory controller 20 may control the nonvolatile memory device 10 in response to a write request or a read request received from the host HOST. For example, the memory controller 20 may transmit to the nonvolatile memory device 10 a write command CMD_w or a read command CMD_r in response to the write request or the read request received from the host HOST. Also, the memory controller 20 may transmit a suspend command CMD_spd, a resume command CMD_rsm, and/or an address ADDR. The address ADDR that the memory controller 20 transmits to the nonvolatile memory device 10 may be a physical address in the nonvolatile memory device 10. The memory controller 20 may exchange data DATA with the nonvolatile memory device 10. In addition, the memory controller 20 may receive a ready/busy signal RnB from the nonvolatile memory device 10.

The nonvolatile memory device 10 may perform operations such as a write operation, a read operation, and an erase operation in response to signals received from the memory controller 20. In some example embodiments, the nonvolatile memory device 10 may transmit the ready/busy signal RnB to the memory controller 20. The ready/busy signal RnB may be a signal indicating whether the nonvolatile memory device 10 is operating or not. For example, when the nonvolatile memory device 10 performs a program operation, the ready/busy signal RnB may be in a busy state (for example, logic low). When the nonvolatile memory device 10 does not perform operations such as the write operation, the read operation, and the erase operation, the ready/busy signal RnB may be in a ready state (for example, logic high).

The memory controller 20 may transmit the suspend command CMD_spd to the nonvolatile memory device 10 in response to the ready/busy signal RnB and the write request or the read request received from the host HOST.

The memory controller 20 may receive a read request having a high priority from the host HOST. In this specification, the read request having a high priority may be referred to as an urgent read request. The memory controller 20 may transmit the suspend command CMD_spd to the nonvolatile memory device 10 in response to a received urgent read request. In other words, when the ready/busy signal RnB is in the busy state, the memory controller 20 may transmit the suspend command CMD_spd to the nonvolatile memory device 10 in response to the received read request having a high priority. The nonvolatile memory device 10 may perform a recovery operation on a selected word line to be programmed in response to the suspend command CMD_spd.

After the recovery operation is complete, the nonvolatile memory device 10 may perform a read operation in response to the urgent read request. The nonvolatile memory device 10 may output the ready/busy signal RnB in the ready state after completing the read operation in response to the urgent read request, and the memory controller 20 may resume the program operation by correspondingly outputting the resume command CMD_rsm to the nonvolatile memory device 10.

The nonvolatile memory device 10 may include a memory cell array 110, a control logic 120, and a recovery mode manager 130. The memory cell array 110 may include a plurality of memory cells. For example, the plurality of memory cells may be flash memory cells. Below, some example embodiments will be described for the case in which the plurality of memory cells are NAND flash memory cells. However, some example embodiments are not limited thereto. In some example embodiments, the plurality of memory cells may be resistive memory cells such as resistive read-only memories (RAMs) (RRAMs), phase-change RAMs (PRAMs), and magneto-resistive RAMs (MRAMs).

According to some example embodiments, operations described herein as being performed by any or all of the control logic 120 and the recovery mode manager 130 may be performed by at least one processor executing program code that includes instructions corresponding to the operations. The instructions may be stored in a memory. The term 'processor,' as used in the present disclosure, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a microprocessor, a central processing unit (CPU), a processor core, a multi-core processor; a multiprocessor, an application-specific integrated circuit (ASIC), and a field programmable gate array (FPGA).

The memory cell array 110 may be a three-dimensional (3D) memory array. The 3D memory array may be monolithically formed on at least one physical level of memory cell arrays which include an active region on a silicon substrate and a circuit related with operation of the memory cells on or in the silicon substrate. The term "monolithic" may mean that layers of each level constituting the memory cell array are directly stacked above the layers of each lower level of the memory cell array. The 3D memory array may include cell strings arranged in a vertical direction so that at least one memory cell is placed on another memory cell. The at least one memory cell may include a charge trapping layer. However, some example embodiments are not limited thereto. In some example embodiments, the memory cell array 110 may be a two-dimensional (2D) memory cell array.

In some example embodiments, each memory cell included in the memory cell array 110 may be a multi-level cell (MLC) storing two or more bits of data. For example, the memory cell may be an MLC storing 2-bit data. As another example, the memory cell may be a triple-level cell (TLC) storing 3-bit data. However, some example embodiments are not limited thereto. In some example embodiments, some memory cells included in the memory cell array 110 may be single-level cells (SLCs) storing 1-bit data and some other memory cells may be MLCs.

The control logic 120 may generally control various operations in the nonvolatile memory device 10 based on the data DATA, the address ADDR, and the commands CMD_w, CMD_r, CMD_spd, and CMD_rsm received from the memory controller 20. For example, the control logic 120 may output various control signals to write the data DATA to the memory cell array 110 or to read the data DATA from the memory cell array 110. In addition, the control logic 120 may output a control signal for performing a recovery on the selected word line.

The recovery mode manager 130 may determine a recovery mode based on the suspend command CMD_spd. The recovery mode may include a cancel mode in which the recovery is immediately, or contemporaneously, performed after receiving the suspend command CMD_spd and a loop mode in which the recovery is performed after a program loop included in the program operation has been performed, depending on a recovery timing. In some example embodiments, the recovery mode manager 130 may differently determine the recovery mode, depending on a reception timing of the suspend command CMD_spd. In some example embodiments, the recovery mode manager 130 may differently determine the recovery mode, depending on the number of received suspend commands CMD_spds. The cancel mode may have an advantage of a contemporaneous response to the urgent read request because the cancel mode contemporaneously performs the recovery, but may have a disadvantage of a delay in the program operation. On the other hand, since the loop mode first completes the program operation and then, responds to the urgent read request, the program operation may not be delayed, but there may be a disadvantage of a delay in response to the urgent read request. According to some example embodiments, the recovery mode manager 130 may determine the recovery mode as one of two different modes based on the suspend command CMD_spd so that a write starvation is mitigated or prevented in which a program request is delayed and an efficient urgent read operation is performed.

In this specification, a case is explained in which the urgent read request is received during the program operation, but it should be understood that an analogy may be applied even when the urgent read request is received during the erase operation.

Figure 2:
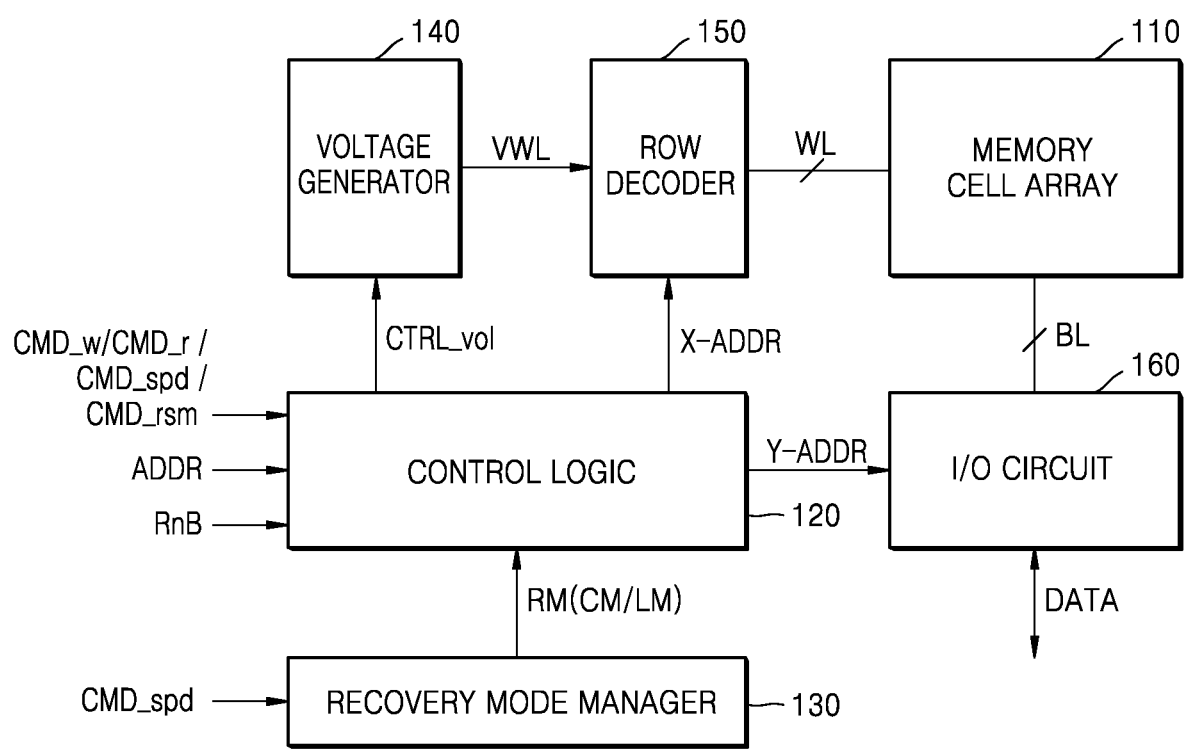
FIG. 2 is a block diagram illustrating a nonvolatile memory device according to some example embodiments.

FIG. 2 is a block diagram illustrating the nonvolatile memory device 10 according to some example embodiments. Repeated descriptions already given above with reference to FIG. 1 will be omitted.

Referring to FIG. 2, the nonvolatile memory device 10 may include the memory cell array 110, the control logic 120, the recovery mode manager 130, a voltage generator 140, a row decoder 150, and an input/output (I/O) circuit 160. According to some example embodiments, operations described herein as being performed by any or all of the voltage generator 140, the row decoder 150 and the I/O circuit 160 may be performed by at least one processor executing program code that includes instructions corresponding to the operations. The instructions may be stored in a memory.

The control logic 120 may output various control signals to write the data DATA to the memory cell array 110 or read the data DATA from the memory cell array 110 based on various commands CMD_w, CMD_r, CMD_spd, and CMD_rsm, and the address ADDR received from the memory controller (20 in FIG. 1). In addition, when the nonvolatile memory device 10 receives the suspend command CMD_spd, the recovery mode manager 130 may correspondingly determine the recovery mode RM and output the determined recovery mode RM to the control logic 120. The recovery mode RM may include the cancel mode CM in which the recovery is immediately performed after, or contemporaneous with, receiving the suspend command CMD_spd and the loop mode LM in which the recovery is performed after the program operation corresponding to a program loop in operation has been performed. The control logic 120 may output various control signals for performing the recovery operation to the memory cell array 110 based on the RM. The cancel mode CM and the loop mode LM will be described below with reference to FIG. 9.

The voltage generator 140 may generate various kinds of voltages for performing the write, read, and erase operations in the memory cell array 110 based on a voltage control signal CTRL_vol. The voltage generator 140 may generate a word line voltage VWL (for example, a program voltage or a write voltage), a read voltage, a pass voltage (or an unselected word line voltage), a verify voltage, a recovery voltage, or the like.

The row decoder 150 may select some word lines WL in response to a row address X-ADDR. The row decoder 150 may transfer the word line voltage VWL to the word line WL. In the program operation, the row decoder 150 may apply the program voltage and the verify voltage to a selected word line, and a program inhibit voltage to an unselected word line. In the read operation, the row decoder 150 may apply the read voltage to the selected word line and the read inhibit voltage to the unselected word line. In the recovery operation, the row decoder 150 may apply the recovery voltage to the selected word line. In addition, the row decoder 150 may select some string selection lines or some ground selection lines in response to the row address X-ADDR.

The I/O circuit 160 may receive the data DATA from the outside (for example, the memory controller 20) and store the input data DATA in the memory cell array 110. In addition, the I/O circuit 160 may read the data DATA from the memory cell array 110 and output the read data DATA to the outside. The I/O circuit 160 may include page buffers (not shown) corresponding to bit lines BL. The page buffer may be connected to the memory cell array 110 via the bit lines BL and may select some of the bit lines BL in response to a column address Y-ADDR received from the control logic 120. In the program operation, the page buffer may operate as a write driver and may program the data DATA to be stored in the memory cell array 110.

Figure 3:
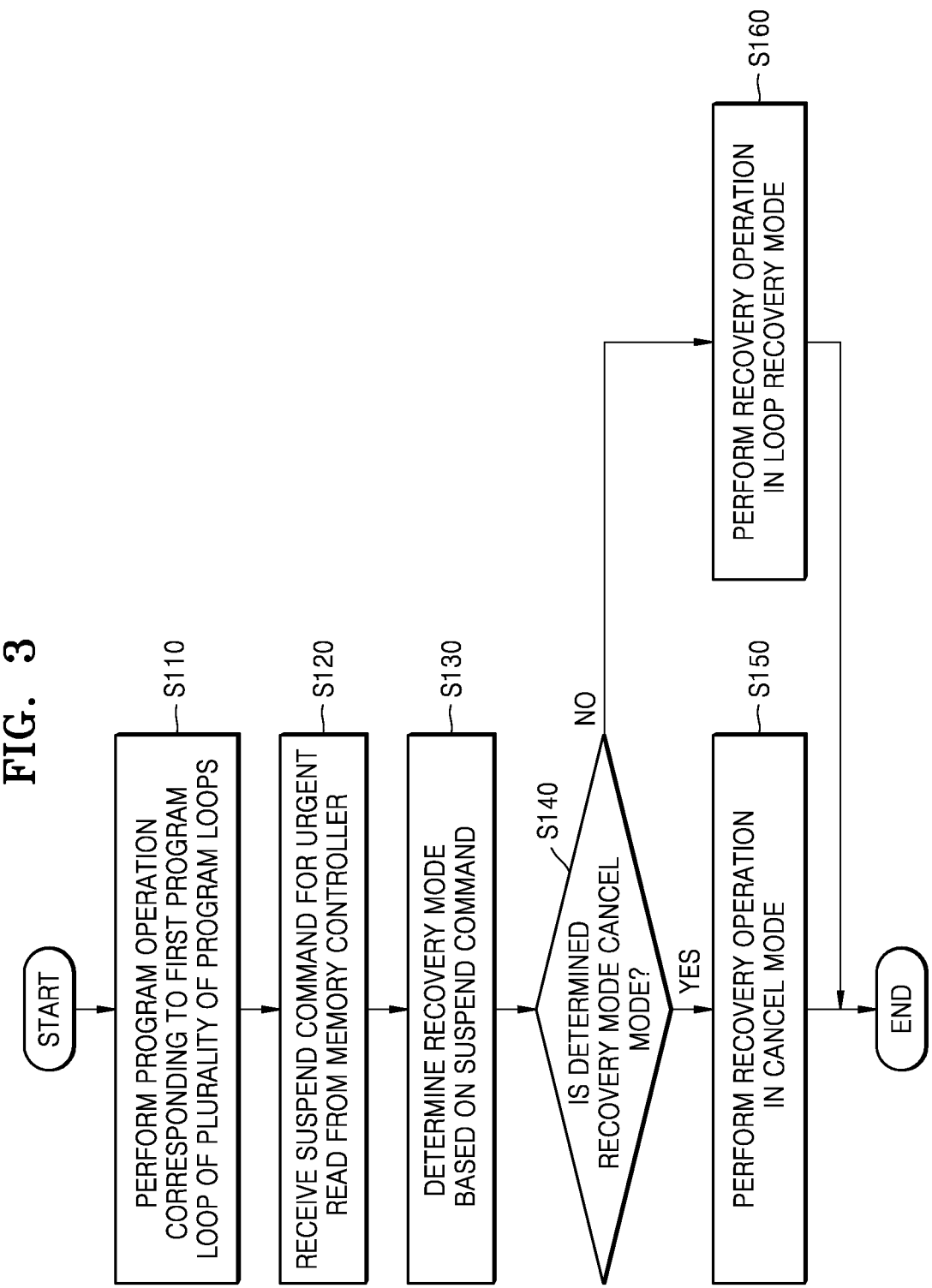
FIG. 3 is a flowchart showing an operation of a nonvolatile memory device determining a recovery mode and performing a recovery operation according to some example embodiments.

FIG. 3 is a flowchart showing an operation of the nonvolatile memory device 10 according to some example embodiments.

Referring to FIGS. 2 and 3, the nonvolatile memory device 10 may perform the program operation corresponding to a first program loop of a plurality of program loops (S110). The nonvolatile memory device 10 may receive the suspend command CMD_spd for an urgent read from the memory controller 20 during the first program loop (S120). The nonvolatile memory device 10 may determine the recovery mode RM based on the suspend command CMD_spd (S130). When the determined recovery mode RM is the cancel mode CM (YES at S140), the nonvolatile memory device 10 may perform the recovery operation in the cancel mode CM (S150). Otherwise, when the determined recovery mode RM is not the cancel mode CM (No at S140), the nonvolatile memory device 10 may perform the recovery operation in the loop mode LM (S160). Although FIG. 3 shows some example embodiments for determining whether the recovery mode RM is the CM, some example embodiments may include determining whether the recovery mode RM is the LM.

Figure 4A:
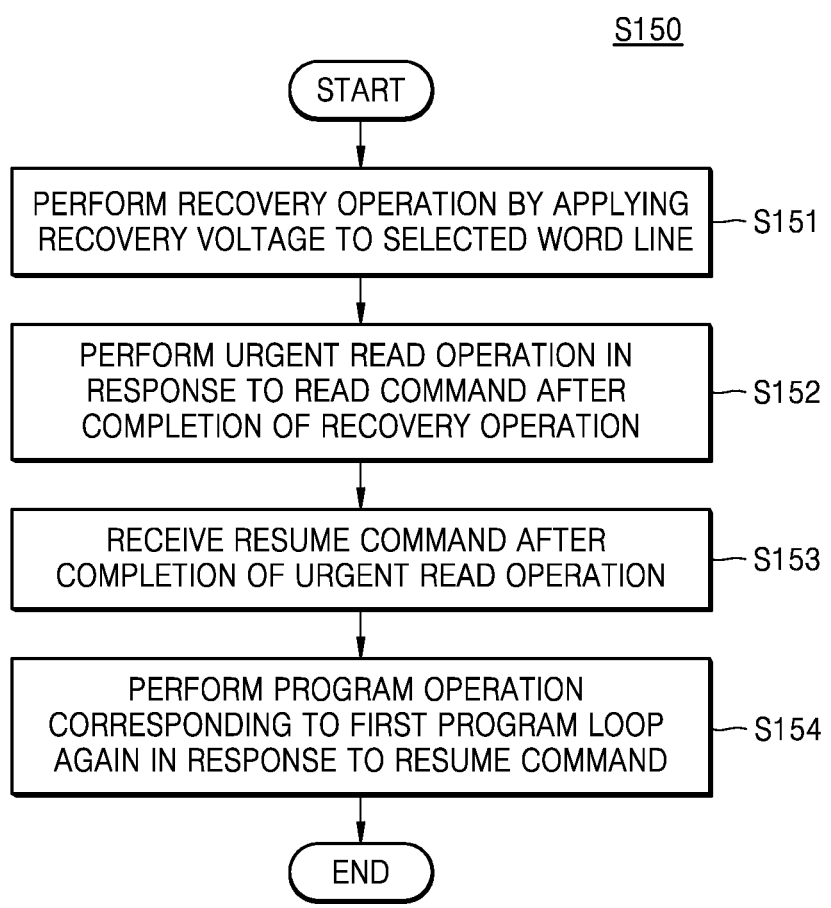
FIG. 4A is a flowchart showing an operation of a nonvolatile memory device performing a recovery operation in cancel mode according to some example embodiments.

FIG. 4A is a flowchart showing an operation of the nonvolatile memory device 10 according to some example embodiments. In detail, FIG. 4A is a flowchart showing an operation of the nonvolatile memory device 10 that performs the recovery in the cancel mode CM according to operation S150 in FIG. 3.

Referring to FIGS. 2 and 4A, the nonvolatile memory device 10 may determine the recovery mode RM to be the CM, and correspondingly immediately, or contemporaneously, perform the recovery operation by applying the recovery voltage to the selected word line WL (S151). In other words, the nonvolatile memory device 10 may immediately, or contemporaneously, perform the recovery operation in response to reception of the suspend command CMD_spd in the CM. The nonvolatile memory device 10 may perform the urgent read operation in response to the read command CMD_r after completion of the recovery operation (S152). Although not shown, in some example embodiments, the nonvolatile memory device 10 may output a ready signal as the ready/busy signal RnB after completion of the recovery operation and the memory controller (20 in FIG. 1) may correspondingly output the read command CMD_r.

The nonvolatile memory device 10 may receive the resume command CMD_rsm after completion of the urgent read operation (S153). Although not shown, in some example embodiments, the nonvolatile memory device 10 may output the ready signal as the ready/busy signal RnB after completion of the urgent read operation and the memory controller (20 in FIG. 1) may correspondingly output the resume command CMD_rsm. The nonvolatile memory device 10 may perform the program operation corresponding to the first program loop again in response to the resume command CMD_rsm (S154).

Figure 4B:
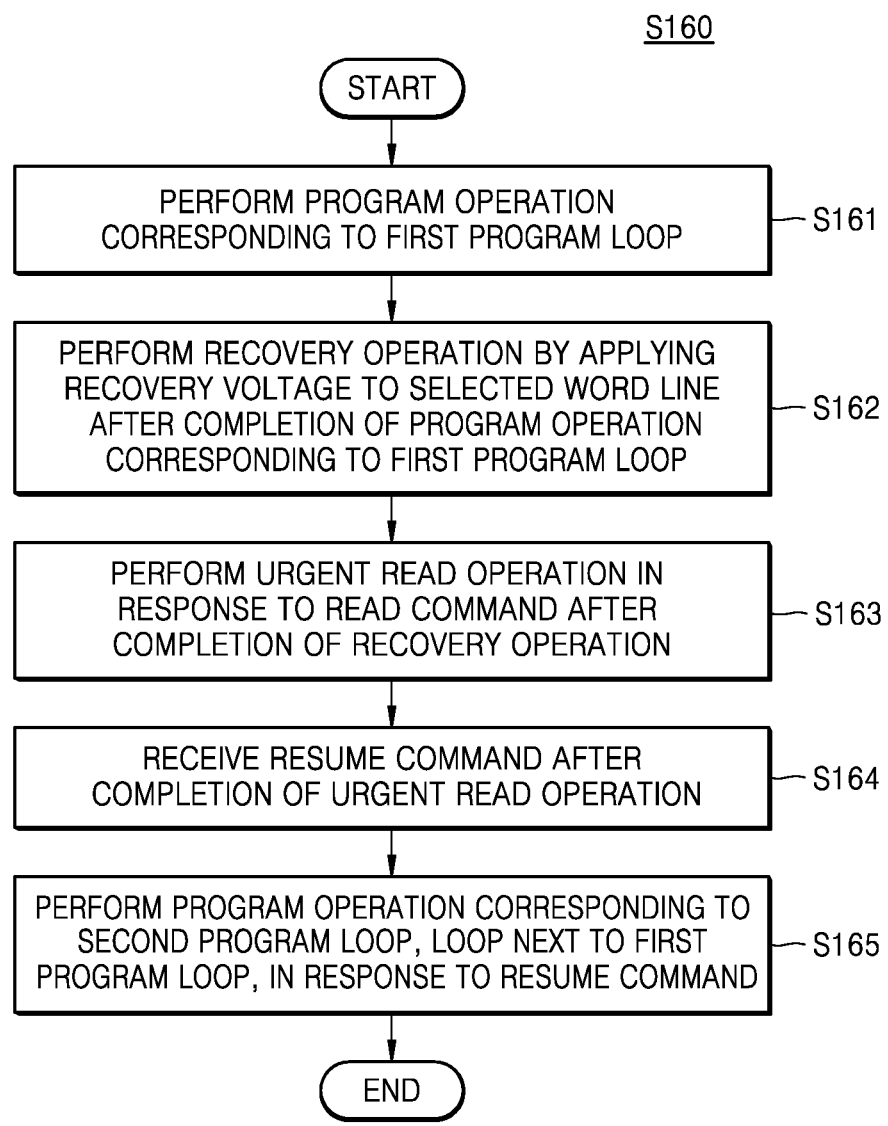
FIG. 4B is a flowchart showing an operation of a nonvolatile memory device performing a recovery operation in loop mode according to some example embodiments.

FIG. 4B is a flowchart showing an operation of the nonvolatile memory device 10 according to some example embodiments. In detail, FIG. 4B is a flowchart showing an operation of the nonvolatile memory device 10 that performs the recovery in the loop mode LM according to operation S160 in FIG. 3.

Referring to FIGS. 2 and 4B, the nonvolatile memory device 10 may determine the recovery mode RM to be the loop mode LM and correspondingly perform the program operation corresponding to the first program loop (S161). In other words, the nonvolatile memory device 10 may continue to perform the program operation corresponding to the first program loop regardless of receiving the suspend command CMD_spd in the LM. In some example embodiments, the program operation corresponding to the first program loop may include a verify operation. After completion of the program operation corresponding to the first program loop, the nonvolatile memory device 10 may perform the recovery operation by applying the recovery voltage to the selected word line (S162).

The nonvolatile memory device 10 may perform the urgent read operation in response to the read command CMD_r after completion of the recovery operation (S163). Although not shown, in some example embodiments, the nonvolatile memory device 10 may output the ready signal as the ready/busy signal RnB after completion of the recovery operation, and the memory controller (20 in FIG. 1) may correspondingly output the read command CMD_r. The nonvolatile memory device 10 may receive the resume command CMD_rsm after completion of the urgent read operation (S164). Although not shown, in some example embodiments, the nonvolatile memory device 10 may output the ready signal as the ready/busy signal RnB after completion of the urgent read operation, and the memory controller (20 in FIG. 1) may correspondingly output the resume command CMD_rsm. Since the program operation for the first program loop has been completed, the nonvolatile memory device 10 may perform the program operation corresponding to a second program loop, which is a loop next to the first program loop, in response to the resume command CMD_rsm (S165).

Figure 5:
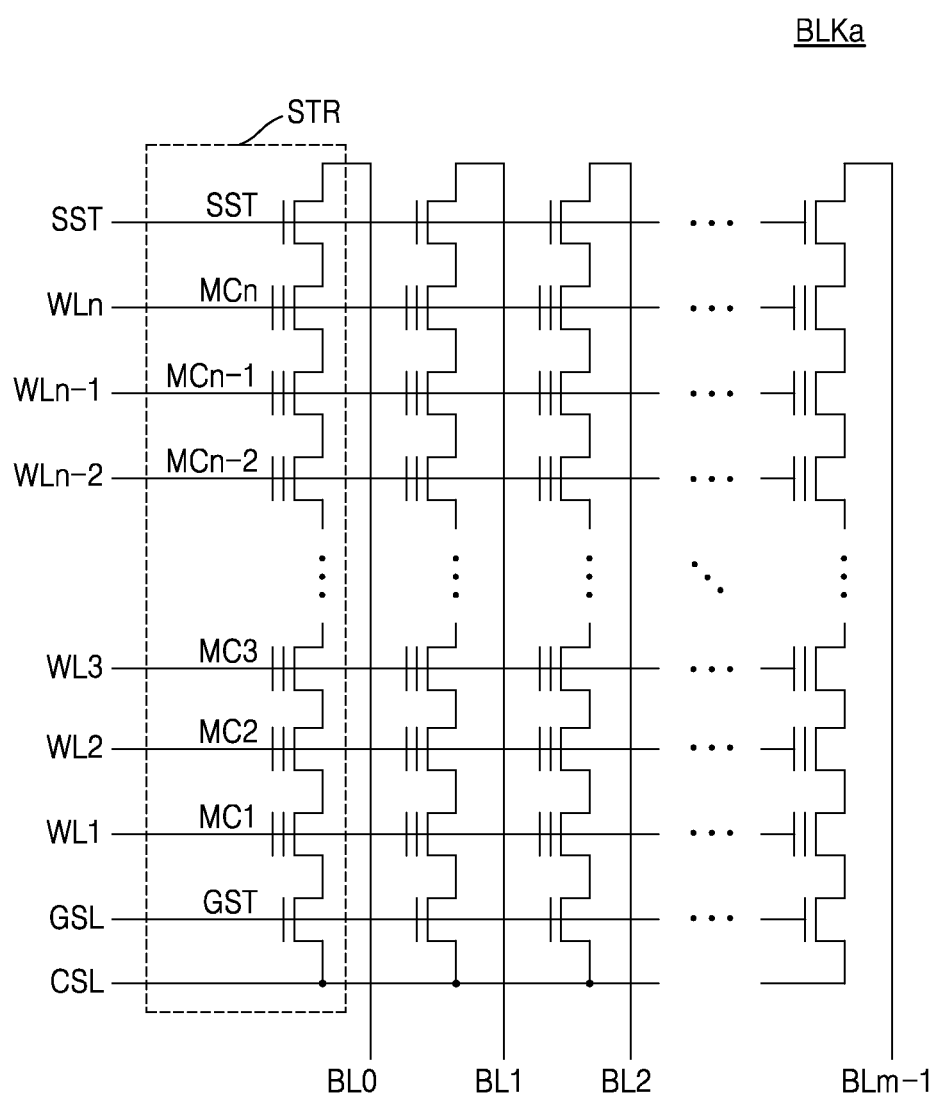
FIG. 5 is a circuit diagram illustrating a single-level memory block included in a memory cell array according to some example embodiments.

FIG. 5 is a circuit diagram illustrating a single-level memory block BLKa included in a memory cell array according to some example embodiments.

Referring to FIG. 5, the memory cell array (for example, 110 in FIG. 2) may be a memory cell array of horizontal NAND flash memories and may include a plurality of memory blocks BLKa. Each memory block BLKa may include m (m is an integer of 2 or more) cell strings STR in which a plurality of memory cells MC are connected in series in a direction from the bit line BL0 to the bit line BLm−1. Each memory block BLKa may also include a ground selection line GSL, a common source line CSL, a string selection transistor SST and a ground selection transistor GST. As an example, FIG. 5 shows a case in which each cell string STR includes eight memory cells MC.

A NAND flash memory device having the structure as shown in FIG. 5 may be erased on a block-by-block basis and perform a program in units of pages respectively corresponding to word lines WL0 through WL7. FIG. 5 shows an example in which n (n is an integer) pages for n word lines (WL1 through WLn) are provided in one block. In addition, the nonvolatile memory device 10 in FIGS. 1 and 2 may also include a plurality of memory cell arrays that perform the same operation with the same structure as the memory cell array 110 described above.

Figure 6:
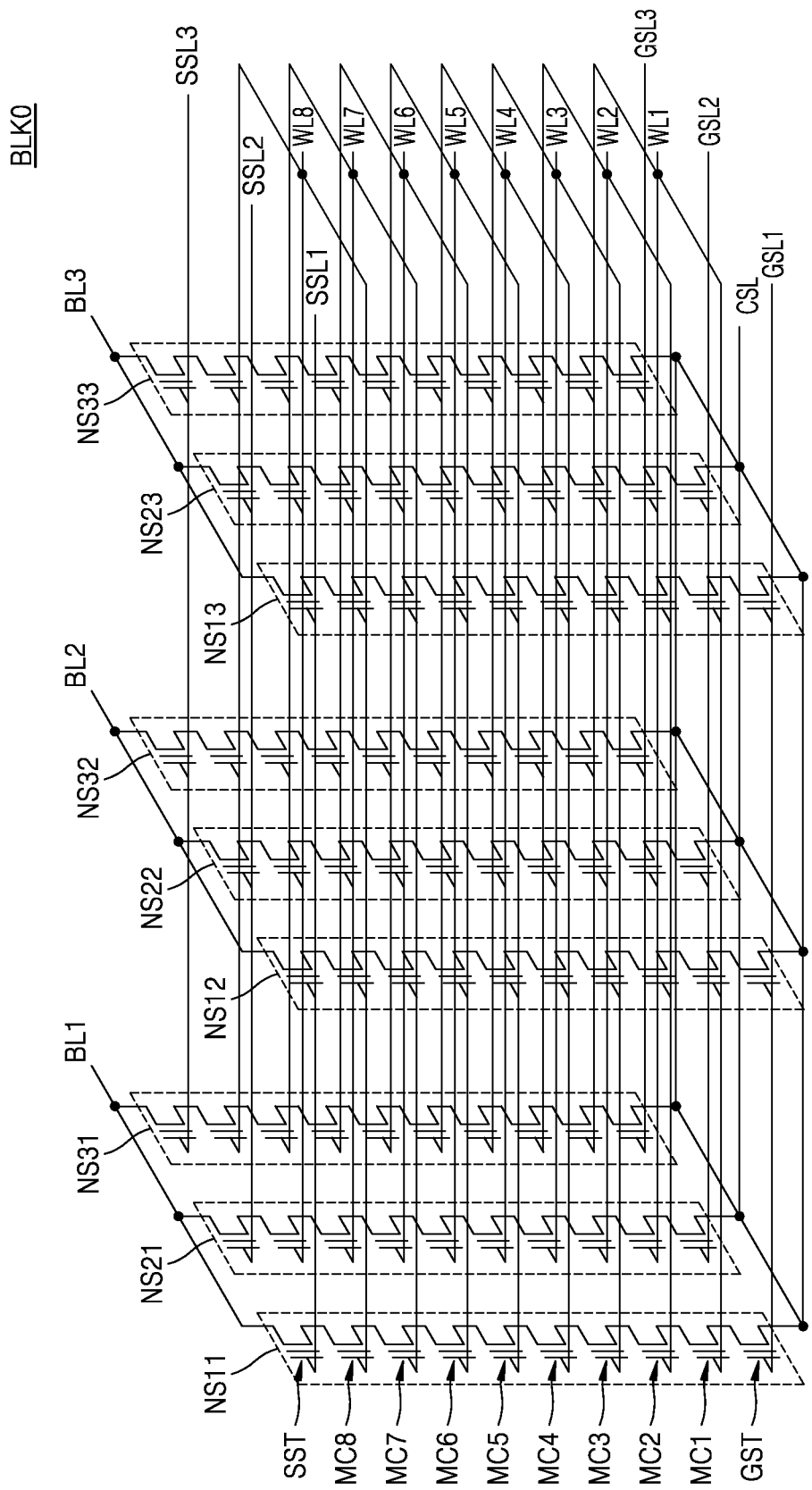
FIG. 6 is a circuit diagram illustrating a multi-level memory block included in a memory cell array according to some example embodiments.

FIG. 6 is a circuit diagram illustrating a multi-level memory block BLK0 included in a memory cell array, according to some example embodiments.

Referring to FIG. 6, the memory cell array (for example, 110 in FIG. 2) may be a memory cell array of a vertical NAND flash memory and include a plurality of memory blocks BLK0. Each memory block BLK0 may include a plurality of NAND strings NS11 through NS33, a plurality of word lines WL1 through WL8, a plurality of bit lines BL1 through BL3, a plurality of ground selection lines GSL1 through GSL3, a plurality of string selection lines SSL1 through SSL3, and a common source line CSL. The numbers of NAND strings, word lines, bit lines, ground selection lines, and string selection lines may be variously changed according to some example embodiments.

NAND strings NS11, NS21, and NS31 may be arranged between the first bit line BL1 and the common source line CSL. NAND strings NS12, NS22, and NS32 may be arranged between the second bit line BL2 and the common source line CSL. NAND strings NS13, NS23, and NS33 may be arranged between the third bit line BL3 and the common source line CSL. Each of the NAND strings (for example, NS11) may include a string selection transistor SST, first through eighth memory cells MC1 through MC8, and a ground selection transistor GST, which are connected in series.

Strings commonly connected to one bit line may form one column. For example, strings NS11, NS21, and NS31 commonly connected to the first bit line BL1 may correspond to a first column, strings NS12, NS22, and NS32 commonly connected to the second bit line BL2 may correspond to a second column, and strings NS13, NS23, and NS33 commonly connected to the third bit line BL3 may correspond to a third column.

Strings connected to one string selection line may form a row. For example, strings NS11, NS12, and NS13 connected to the first string selection line SSL1 may correspond to a first row, strings NS21, NS22, and NS23 connected to the second string selection line SSL2 may correspond to a second row, and strings NS31, NS32, and NS33 connected to the third string selection line SSL3 may correspond to a third row.

The string selection transistor SST may be connected to corresponding string selection lines SSL1 through SSL3. Each of the first through eighth memory cells MC1 through MC8 may be connected to corresponding word lines WL1 through WL8. The ground selection transistor GST may be connected to corresponding ground selection lines GSL1 through GSL3. The string selection transistor SST may be connected to corresponding bit lines BL1 through BL3, and the ground selection transistor GST may be connected to the common source line CSL.

Word lines on the same level (for example, WL1) may be commonly connected to each other, while string selection lines SSL1 through SSL3 may be spaced apart from each other and ground selection lines GSL1 through GSL3 may be spaced apart from each other. For example, when memory cells connected to the first word line WL1 and belonging to strings NS11, NS12, and NS13 are programmed, the first word line WL1 and the first string selection line SSL1 may be selected. The ground selection lines GSL1 through GSL3 may be commonly connected to each other.

Figure 7:
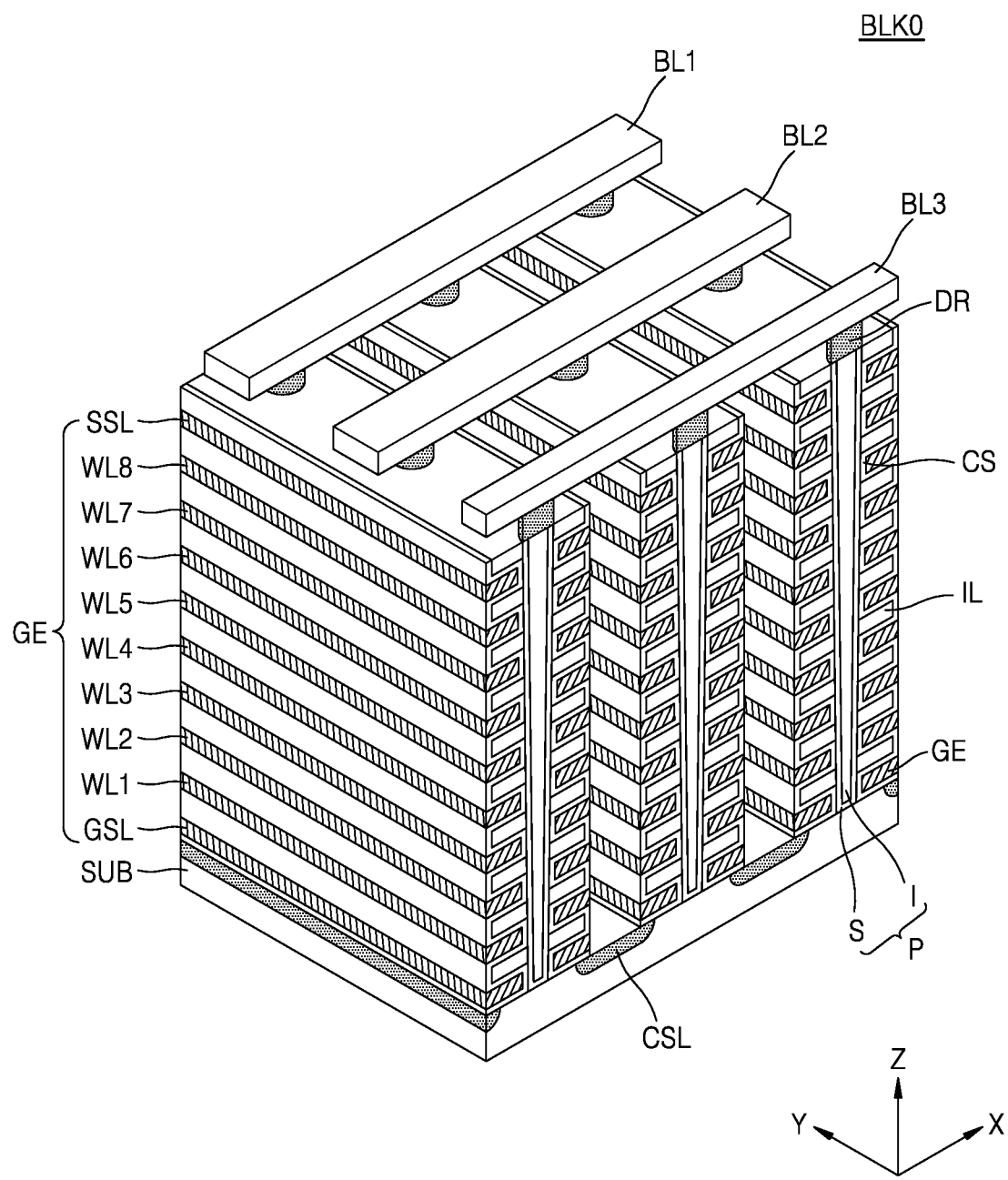
FIG. 7 is a perspective view of the memory block of FIG. 6.

FIG. 7 is a perspective view of the memory block BLK0 of FIG. 6.

Referring to FIG. 7, each memory block BLK0 included in a memory cell array (for example, 110 in FIG. 2) may be formed in a vertical direction with respect to a substrate SUB. In FIG. 7, the memory block BLK0 is illustrated as including two selection lines GSL and SSL, eight word lines WL1 through WL8, and three bit lines BL1 through BL3, but the numbers thereof may actually be more or less than these numbers.

The substrate SUB may be of a first conductivity type (for example, a p-type), and the common source line CSL that extends therein in a first direction (for example, a Y-direction) and is of a second conductivity type (for example, n-type) may be provided. A plurality of insulating layers IL, which extend in the first direction, may be sequentially provided on a region of the substrate SUB between two adjacent common source lines CSL in a third direction (for example, a Z-direction), and the plurality of insulating layers IL may be separate from each other by a certain distance in the third direction. For example, the plurality of insulating layers IL may include an insulating material such as silicon oxide.

A plurality of pillars Ps may be formed which are sequentially arranged in the first direction on the region of the substrate SUB between two adjacent common source lines CSLs, and penetrate the plurality of insulating layers ILs in the third direction. For example, the plurality of pillars P may penetrate the plurality of insulating layers IL and contact the substrate SUB. In detail, a surface layer S of each pillar P may include a silicon material of the first type, and may function as a channel region. An inner layer I of each pillar P may include an insulating material such as silicon oxide or an air gap.

A charge storage layer CS may be provided along exposed surfaces of the insulating layers IL, the pillars P, and the substrate SUB, in a region between two adjacent common source lines CSL. The charge storage layer CS may include a gate insulating layer (or "a tunnelling insulating layer"), a charge trapping layer, and a blocking insulating layer. For example, the charge storage layer CS may have an oxide-nitride-oxide (ONO) structure. In addition, a gate electrode GE including selection lines GSL and SSL and word lines WL1 through WL8 may be provided on an exposed surface of the charge storage layer CS, in a region between two adjacent common source lines CSL.

Drains or drain contacts DR may be respectively provided on the plurality of the pillars P. For example, the drains DR may include a silicon material doped with impurities of the second conductivity type. The bit lines BL1 through BL3, which extend in the second direction (for example, the X-direction) and are separated from each other by a certain distance in the first direction, may be provided on the drains DR.

Figure 8:
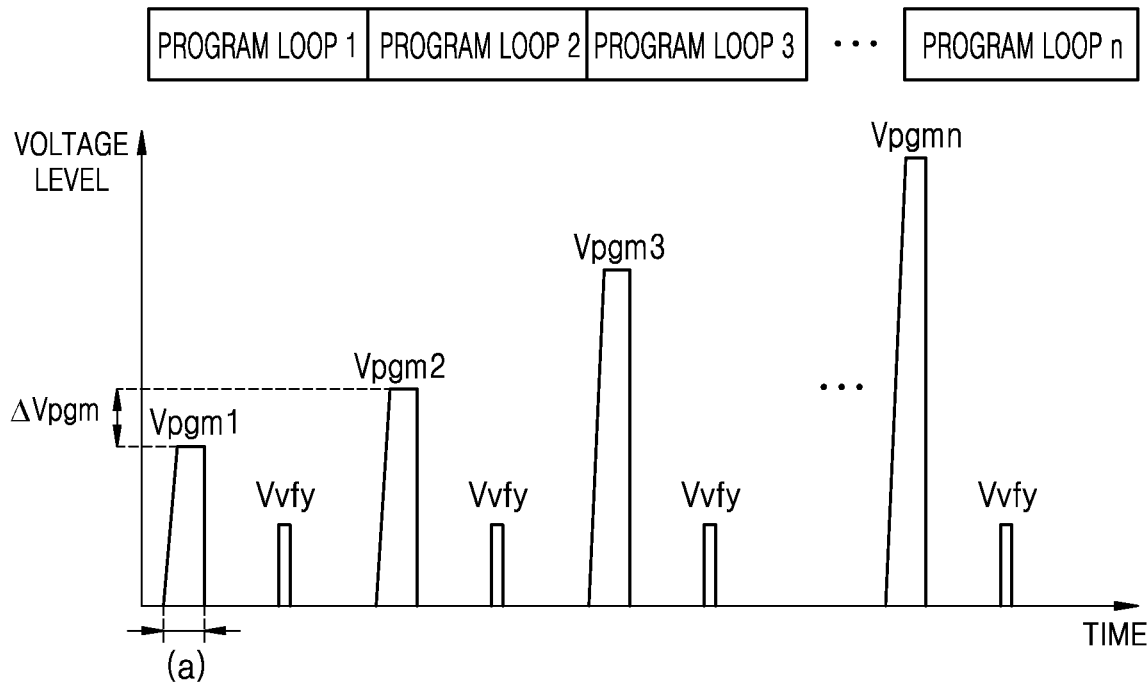
FIG. 8 is a graph showing voltage levels of selected word lines during a sequence of program operations of a nonvolatile memory device according to some example embodiments.

FIG. 8 is a graph showing voltage levels of selected word lines during a sequence of program operations of the nonvolatile memory device 10 according to some example embodiments. In the graph shown in FIG. 8, the x-axis may denote time and the y-axis may denote a voltage level. For convenience of description, it is assumed that the nonvolatile memory device (10 in FIG. 1) performs the program operation on a page basis. However, some example embodiments are not limited thereto, and a program method of the nonvolatile memory device (10 in FIG. 1) may be variously modified and applied.

Referring to FIGS. 2 and 8, the nonvolatile memory device 10 may perform the program operation based on an Incremental Step Pulse Program (ISPP) method. In other words, the nonvolatile memory device 10 may perform the program operation through a plurality of program loops Program Loop 1 through Program Loop n (n is an integer of one or more). Each of the program operations corresponding to the plurality of program loops Program Loop 1 through Program Loop n may be configured to include a program voltage apply operation in which program voltages $Vpgm\_1$ through $Vpgm\_n$ (n is an integer of one or more) are applied and the verify operation in which a verify voltage Vvfy verifies. As the number of program loops increases, an applied program voltage Vpgm may increase by a program voltage increment $\Delta Vpgm$. The memory cells which have been program passed in the verify operation may be program inhibited in a next program loop.

Figure 9:
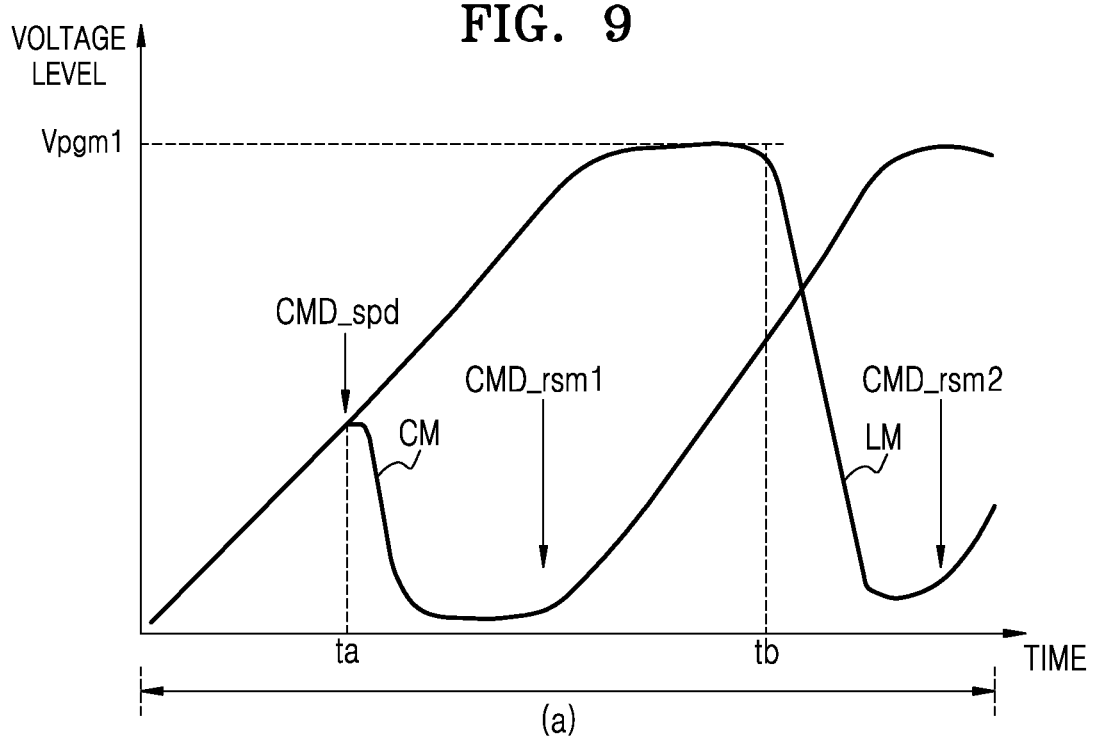
FIG. 9 is a graph showing voltage levels of a selected word lines during a program operation of a nonvolatile memory device in response to recovery operations in cancel mode and loop mode according to some example embodiments.

FIG. 9 is a graph showing the voltage levels of selected word lines during a program operation of the nonvolatile memory device 10 in response to recovery operations in cancel mode and loop mode according to some example embodiments. In detail, FIG. 9 is an enlarged graph of the first program loop Program Loop 1 in a section (a) in FIG. 8. In the graph shown in FIG. 9, the x-axis may denote time and the y-axis may denote the voltage level.

Referring to FIGS. 1 and 9, the voltage level of the selected word line to be programmed in the nonvolatile memory device 10 may gradually increase until the voltage level reaches a first program voltage Vpgm1. The nonvolatile memory device 10 may receive the suspend command CMD_spd at a first timing ta. In the CM, the nonvolatile memory device 10 may immediately, or contemporaneously, perform the recovery operation by applying the recovery voltage to the selected word line at the first timing ta at which the suspend command CMD_spd is received. Accordingly, the voltage level of the selected word line may drop to the recovery voltage at the first timing ta. The nonvolatile memory device 10 may perform the first program loop Program Loop 1 that has been suspended, in response to a first resume command CMD_rsm1 after the urgent read operation has been performed.

In the LM, the nonvolatile memory device 10 may perform the program operation corresponding to the first program loop Program Loop 1 despite receiving the suspend command CMD_spd. Although not shown, in some example embodiments, the nonvolatile memory device 10 may contemporaneously perform the verify operation included in the first program loop Program Loop 1. At a second timing tb at which the first program loop Program Loop 1 is complete, the nonvolatile memory device 10 may perform the recovery operation by applying the recovery voltage to the selected word line. Accordingly, the voltage level of the selected word line may drop to the recovery voltage at the second timing tb. The nonvolatile memory device 10 may perform the second program loop Program Loop 2, which is a sequence following the first program loop Program Loop 1, in response to a second resume command CMD_rsm2 after the urgent read operation has been performed.

In the CM, since the recovery is immediately, or contemporaneously, performed at the first timing ta at which the suspend command CMD_spd is received, the program operation may be delayed and the program operation corresponding to the first program loop Program Loop 1 may be complete after the section (a), but the urgent read request may be immediately, or contemporaneously, responded. In the LM, since the program operation is first completed and then, the urgent read request corresponding to the suspend command CMD_spd is responded, the program operation may not be delayed, but there may be a delay in responding to the urgent read request. According to some example embodiments, the write starvation in which the program request is delayed may be mitigated or prevented and the efficient urgent read operation may be performed by differently determining the recovery mode RM based on the suspend command CMD_spd.

Figure 10:
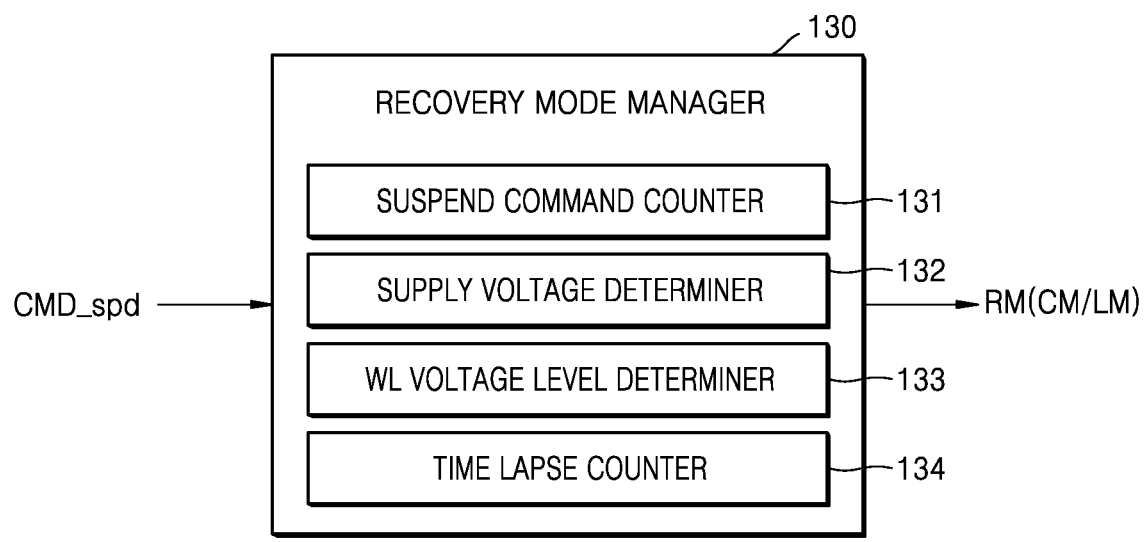
FIG. 10 is a block diagram showing a recovery mode manager according to some example embodiments.

FIG. 10 is a block diagram showing the recovery mode manager 130 according to some example embodiments. Repeated descriptions already given above with reference to FIG. 1 will be omitted.

Referring to FIG. 10, the recovery mode manager 130 may include a suspend command counter 131, a supply voltage determiner 132, a word line voltage level determiner 133, and a time suspended counter 134 (also referred to as a time lapse counter herein). As described above with reference to FIG. 1, the recovery mode manager 130 may determine the recovery mode RM based on the suspend command CMD_spd received from the memory controller (20 in FIG. 1), and output the determined recovery mode RM to the control logic (120 in FIG. 1). According to some example embodiments, operations described herein as being performed by any or all of the suspend command counter 131, the supply voltage determiner 132, the word line voltage level determiner 133, and the time suspended counter 134 may be performed by at least one processor executing program code that includes instructions corresponding to the operations. The instructions may be stored in a memory.

The suspend command counter 131 may count the suspend commands CMD_spd received from the memory controller (20 in FIG. 1) and determine the recovery mode RM by comparing a suspend command count generated as a result thereof with a reference count. In some example embodiments, the reference count may be determined. In some example embodiments, the suspend command counter 131 may determine the recovery mode RM to be the cancel mode CM when the suspend command count is less than the reference count, and may determine the recovery mode RM to be the loop mode LM when the suspend command count is equal to or greater than the reference count. In some example embodiments, the suspend command counter 131 may include at least one counter or a flip-flop for the suspend command count. This will be described below with reference to FIGS. 11A and 11B.

The supply voltage determiner 132 may determine the recovery mode RM by receiving information on a supply voltage level of the supply voltage supplied to the selected word line upon receiving the suspend command CMD_spd from the control logic (120 in FIG. 1), and by comparing the received supply voltage level with a reference voltage. The nonvolatile memory device (10 in FIG. 1) may apply a supply voltage having a stepped-up voltage level to the selected word line for increasing the voltage level of the selected word line in the program operation. In some example embodiments, the reference voltage may be determined. In some example embodiments, the supply voltage determiner 132 may determine the recovery mode RM to be the cancel mode CM when the supply voltage level is lower than the reference voltage level, and may determine the recovery mode RM to be the loop mode LM when the supply voltage level is equal to or higher than the reference voltage level. This will be described below with reference to FIGS. 12A and 12B.

In some example embodiments, the nonvolatile memory device (10 in FIG. 1) may apply different supply voltages to the selected word lines by a plurality of operations. In some example embodiments, the control logic (120 in FIG. 1) may generate stepped information according to the supply voltage level and the supply voltage determiner 132 may determine the recovery mode RM based on the stepped information received from the control logic (120 in FIG. 1).

The word line voltage level determiner 133 may receive information on the voltage level of the selected word line at an instant at which the suspend command CMD_spd is received from the memory cell array (110 in FIG. 1), and determine the recovery mode RM by comparing the received selected word line voltage level with the reference voltage. In some example embodiments, the reference voltage may be determined. In some example embodiments, the word line voltage level determiner 133 may determine the recovery mode RM to be the cancel mode CM when the selected word line voltage level is lower than the reference voltage level, and may determine the recovery mode RM to be the loop mode LM when the selected word line voltage level is equal to or higher than the reference voltage level. This will be described below with reference to FIGS. 13A and 13B.

The time suspended counter 134 may count time suspended from the instant at which the nonvolatile memory device (10 in FIG. 1) starts to increase the voltage level of the selected word line for the program operation to the instant at which the suspend command CMD_spd is received, and may determine the recovery mode RM by comparing the counted time suspended with a reference time. In some example embodiments, the reference time may be determined. In some example embodiments, the time suspended counter 134 may determine the recovery mode RM to be the cancel mode CM when the time suspended is shorter than the reference time, and determine the recovery mode RM to be the loop mode LM when the time suspended is equal to or longer than the reference time. This will be described below with reference to FIGS. 14A and 14B.

In FIG. 10, the recovery mode manager 130 may include the suspend command counter 131, the supply voltage determiner 132, the word line voltage level determiner 133, and the time suspended counter 134, but some example embodiments are not limited thereto. The recovery mode manager 130 may include at least one of the suspend command counter 131, the supply voltage determiner 132, the word line voltage level determiner 133, and the time suspended counter 134, and may determine the recovery mode RM by using components included therein.

Figure 11A:
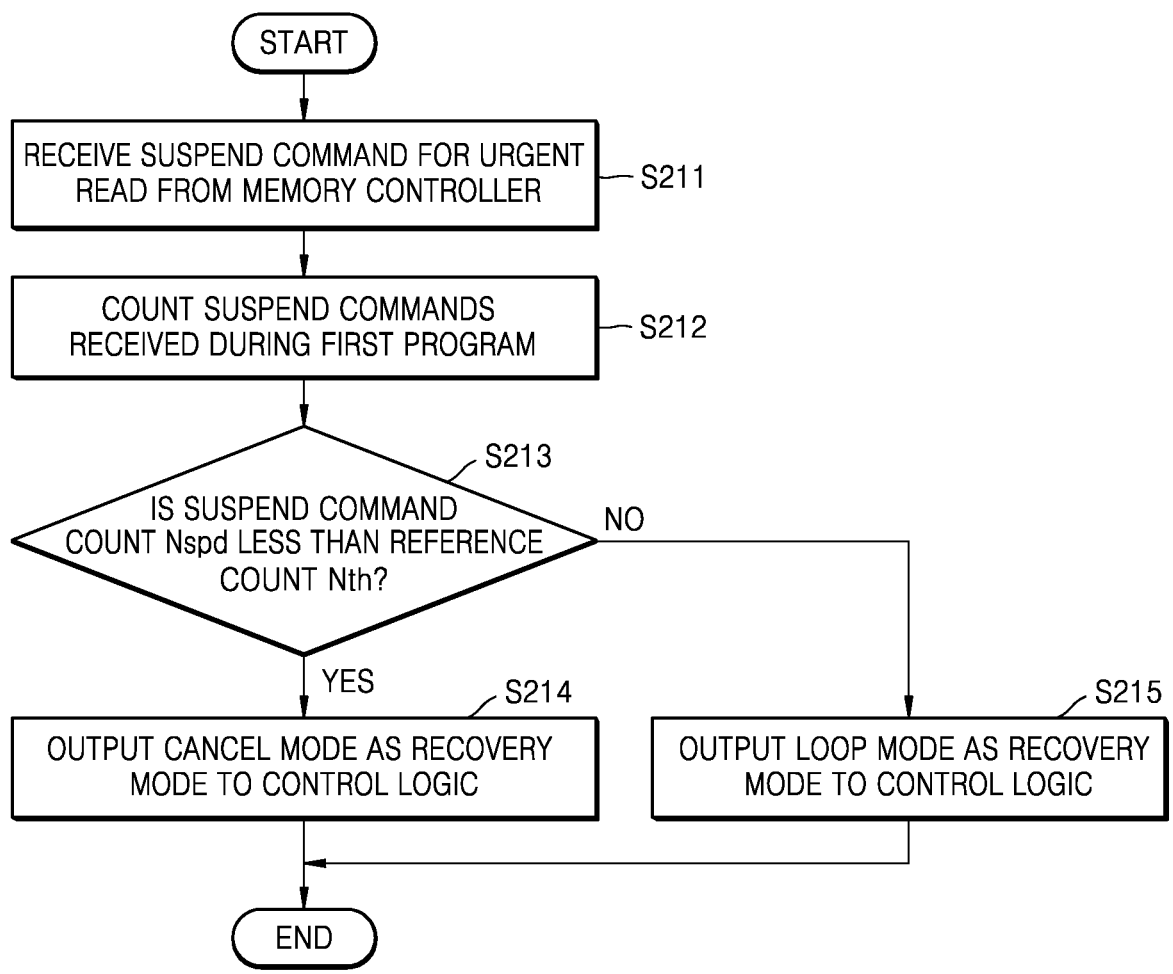
FIG. 11A is a flowchart showing an operation of a recovery mode manager determining a recovery mode using a suspend command counter according to some example embodiments.

FIG. 11A is a flowchart showing an operation of the recovery mode manager 130 according to some example embodiments. In detail, FIG. 11A shows some example embodiments in which the recovery mode manager 130 determines the recovery mode RM by using the suspend command counter 131.

Referring to FIGS. 2 and 11A, the recovery mode manager 130 may receive the suspend command CMD_spd for an urgent read from the memory controller (20 in FIG. 1) (S211). The recovery mode manager 130 may generate a suspend command count Nspd by counting the suspend commands CMD_spd received during the first program loop Program Loop 1 among the plurality of program loops Program Loop 1 through Program Loop n (S212). The recovery mode manager 130 may compare the suspend command count Nspd with the reference count Nth (S213). When the suspend command count Nspd is less than the reference count Nth, the recovery mode manager 130 may output the cancel mode CM as the recovery mode RM to the control logic 120 (S214). Otherwise, when the suspend command count Nspd is not less than the reference count Nth, the recovery mode manager 130 may output the loop mode LM as the recovery mode RM to the control logic 120 (S215).

Figure 11B:
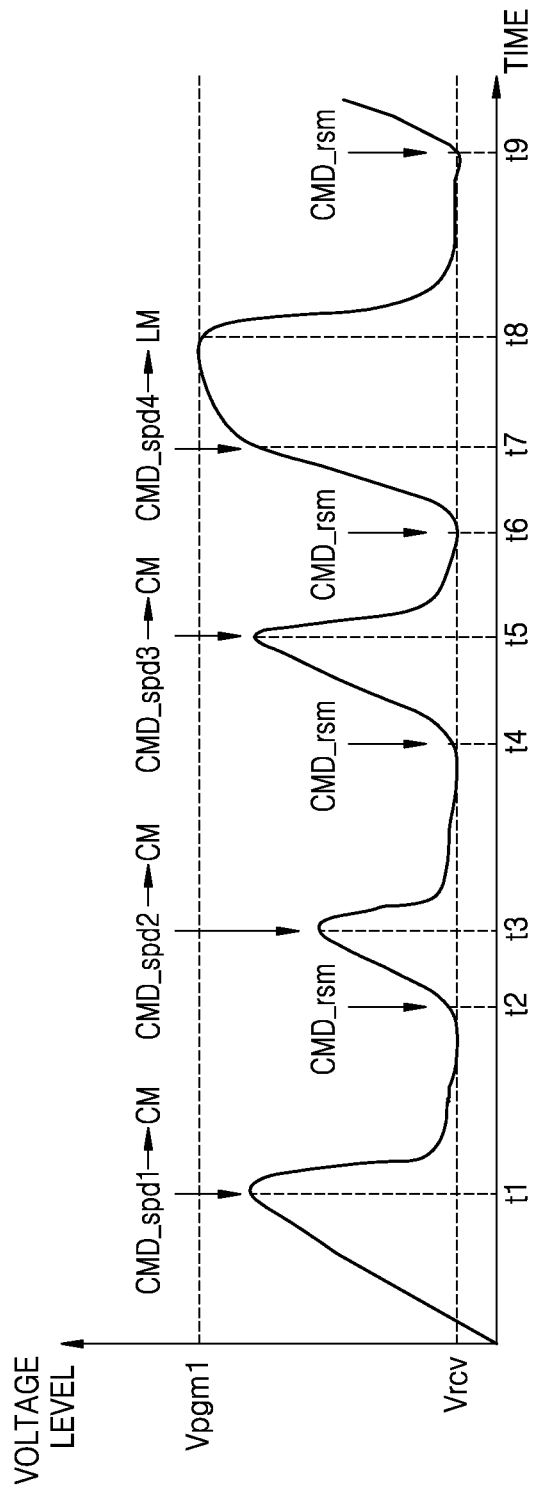
FIG. 11B is a graph showing voltage levels of selected word lines during a sequence of operations of a recovery mode manager determining a recovery mode using a suspend command counter according to some example embodiments.

FIG. 11B is a graph showing voltage levels of selected word lines during a sequence of operations of the recovery mode manager 130 according to some example embodiments. In detail, FIG. 11B shows some example embodiments in which the recovery mode manager 130 determines the recovery mode RM by using the suspend command counter 131. In addition, FIG. 11B shows an example in which the reference count Nth is '4'.

Referring to FIGS. 2, 11A, and 11B, while the nonvolatile memory device 10 performs the first program loop Program Loop 1, the recovery mode manager 130 may receive the first suspend command CMD_spd1 at the first timing t1 and correspondingly count the suspend command count Nspd as '1'. Since the suspend command count Nspd or '1' is less than the reference count Nth or '4', the recovery mode manager 130 may output the cancel mode CM as the recovery mode RM to the control logic 120. The control logic 120 may immediately, or contemporaneously, perform the recovery operation by lowering the voltage level of the selected word line to the recovery voltage Vrcv in response to the received CM. Although not shown, the nonvolatile memory device 10 may perform the urgent read operation between the first timing t1 and the second timing t2, after the recovery operation has been complete. After completion of the emergency read operation, the nonvolatile memory device 10 may again perform the first program loop Program Loop 1 in response to the resume command CMD_rsm at the second timing t2.

The recovery mode manager 130 may receive a second suspend command CMD_spd2 at a third timing t3 and correspondingly count the suspend command count Nspd as '2'. Since the suspend command count Nspd or '2' is less than the reference count Nth or '4', the recovery mode manager 130 may output the cancel mode CM as the recovery mode RM to the control logic 120. The control logic 120 may immediately, or contemporaneously, perform the recovery operation by lowering the voltage level of the selected word line to the recovery voltage Vrcv in response to the received CM. Although not shown, the nonvolatile memory device 10 may perform the urgent read operation between the third timing t3 and a fourth timing t4, after the recovery operation has been complete. After completion of the urgent read operation, the nonvolatile memory device 10 may again perform the first program loop Program Loop 1 in response to the resume command CMD_rsm at the fourth timing t4.

The recovery mode manager 130 may receive a third suspend command CMD_spd3 at a fifth timing t5 and correspondingly count the suspend command count Nspd as '3'. Since the suspend command count Nspd or '3' is less than the reference count Nth or '4', the recovery mode manager 130 may output the cancel mode CM as the recovery mode RM to the control logic 120. The control logic 120 may immediately, or contemporaneously, perform the recovery operation by lowering the voltage level of the selected word line to the recovery voltage Vrcv in response to the received CM. Although not shown, the nonvolatile memory device 10 may perform the urgent read operation between the fifth timing t5 and a sixth timing t6, after the recovery operation has been complete. After completion of the urgent read operation, the nonvolatile memory device 10 may again perform the first program loop Program Loop 1 in response to the resume command CMD_rsm at the sixth timing t6.

The recovery mode manager 130 may receive a fourth suspend command CMD_spd4 at a seventh timing t7 and correspondingly count the suspend command count Nspd as '4'. Since the suspend command count Nspd or '4' is not less than the reference count Nth or '4', the recovery mode manager 130 may output the loop mode LM as the recovery mode RM to the control logic 120. The control logic 120 may complete the first program loop Program Loop 1 by increasing the voltage level of the selected word line to the first program voltage Vpgm1, without immediately, or contemporaneously, performing the recovery operation in response to the received LM. The nonvolatile memory device 10 may perform the recovery operation at an eighth timing t8 at which the first program loop Program Loop 1 is complete. Although not shown, the nonvolatile memory device 10 may perform the urgent read operation between the eighth timing t8 and a ninth timing t9, after the recovery operation has been complete. After completion of the urgent read operation, the nonvolatile memory device 10 may perform the second program loop Program Loop 2, which is a sequence following the first program loop Program Loop 1, in response to the resume command CMD_rsm at the ninth timing t9.

Figure 12A:
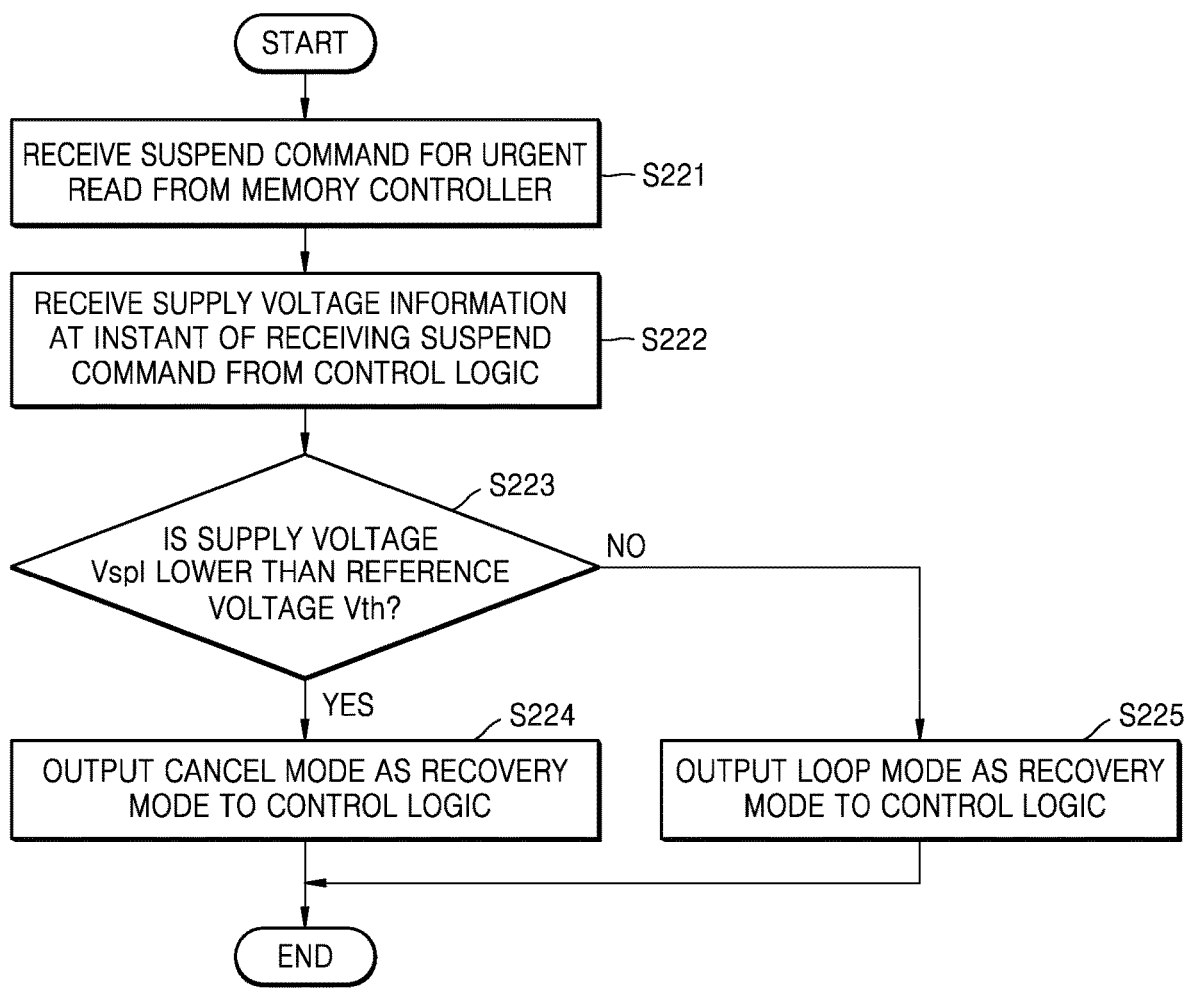
FIG. 12A is a flowchart showing an operation of a recovery mode manager determining a recovery mode using a supply voltage determiner according to some example embodiments.

FIG. 12A is a flowchart showing an operation of the recovery mode manager 130 according to some example embodiments. In detail, FIG. 12A shows some example embodiments in which the recovery mode manager 130 determines the recovery mode RM by using the supply voltage determiner 132.

Referring to FIGS. 2 and 12A, the recovery mode manager 130 may receive the suspend command CMD_spd for the urgent read from the memory controller (20 in FIG. 1) (S221). The recovery mode manager 130 may receive supply voltage information upon receiving the suspend command CMD_spd from the control logic 120 (S222). The recovery mode manager 130 may compare the supply voltage Vsp1 with the reference voltage Vth (S223). When the supply voltage Vsp1 is lower than the reference voltage Vth, the recovery mode manager 130 may output the cancel mode CM as the recovery mode RM to the control logic 120 (S224). Otherwise, when the supply voltage Vsp1 is not lower than the reference voltage Vth, the recovery mode manager 130 may output the loop mode LM as the recovery mode RM to the control logic 120 (S225).

As described above with reference to FIG. 10, in some example embodiments, the recovery mode manager 130 may determine the recovery mode RM based on step information according to the supply voltage level from the control logic 120. In some example embodiments, the recovery mode manager 130 may output the cancel mode CM as the recovery mode RM to the control logic 120 when the step information is before a reference step, and may output the loop mode LM as the recovery mode RM to the control logic 120 when the step information is not before the reference step.

Figure 12B:
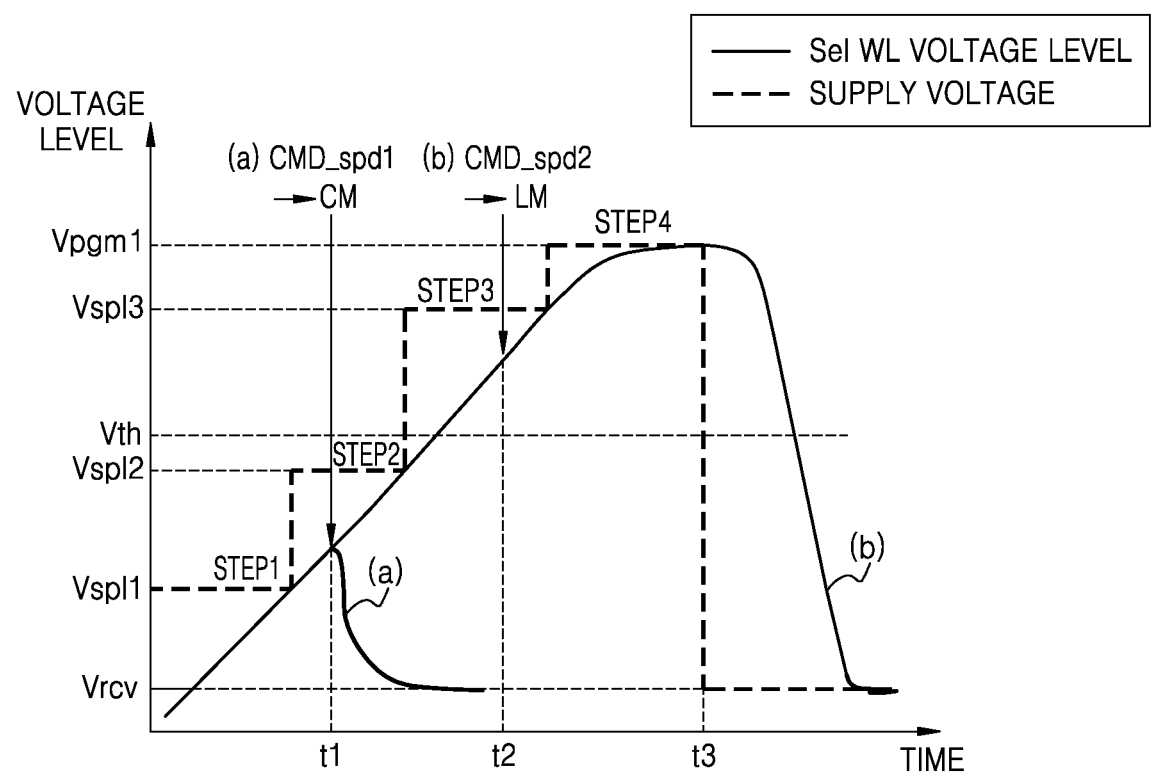
FIG. 12B is a graph showing voltage levels of selected word lines during an operation of a recovery mode manager determining a recovery mode using a supply voltage determiner according to some example embodiments.

FIG. 12B is a graph showing voltage levels of selected word lines during an operation of the recovery mode manager 130 according to some example embodiments. In detail, FIG. 12B shows some example embodiments in which the recovery mode manager 130 determines the recovery mode RM by using the supply voltage determiner 132.

Referring to FIGS. 2, 12A and 12B, the nonvolatile memory device 10 may, for increasing the voltage level of the selected word line to the first program voltage Vpgm1, apply a first supply voltage Vspl1 at a first step Step1, a second supply voltage Vspl2 at a second step Step2, a third supply voltage Vspl3 at a third step Step3, and the first program voltage Vpgm1 at a fourth step Step4. In some example embodiments of FIG. 12B, the voltage level of the reference voltage Vth may be higher than the second supply voltage Vspl2 and lower than the third supply voltage Vspl3.

In an example (a), the recovery mode manager 130 may receive the first suspend command CMD_spd1 at the first timing t1 while the nonvolatile memory device 10 performs the first program loop Program Loop 1. In addition, the recovery mode manager 130 may receive information on the second supply voltage Vspl2 at the first timing t1 from the control logic 120. Since the second supply voltage Vspl2 is lower than the reference voltage Vth, the recovery mode manager 130 my output the cancel mode CM as the recovery mode RM to the control logic 120. The control logic 120 may immediately, or contemporaneously, perform the recovery operation by lowering the voltage level of the selected word line (depicted as "Sel WL VOLTAGE LEVEL") to the recovery voltage Vrcv in response to the received CM. Although not shown, after completion of the recovery operation, the nonvolatile memory device 10 may perform the urgent read operation. In addition, after completion of the urgent read operation, the nonvolatile memory device 10 may again perform the first program loop Program Loop 1 in response to the resume command CMD_rsm.

In an example (b), the recovery mode manager 130 may receive the second suspend command CMD_spd2 at the second timing t2 while the nonvolatile memory device 10 performs the first program loop Program Loop 1. In addition, the recovery mode manager 130 may receive information on the third supply voltage Vspl3 at the second timing t2 from the control logic 120. Since the third supply voltage Vspl3 is not lower than the reference voltage Vth, the recovery mode manager 130 my output the loop mode LM as the recovery mode RM to the control logic 120. The control logic 120 may complete the first program loop Program Loop 1 by increasing the voltage level of the selected word line to the first program voltage Vpgm1, without immediately, or contemporaneously, performing the recovery operation in response to the received LM. The nonvolatile memory device 10 may perform the recovery operation at the third timing t3 at which the first program loop Program Loop 1 is complete. Although not shown, after completion of the recovery operation, the nonvolatile memory device 10 may perform the urgent read operation. In addition, after completion of the urgent read operation, the nonvolatile memory device 10 may perform the second program loop Program Loop 2, which is a sequence following the first program loop Program Loop 1, in response to the resume command CMD_rsm.

The recovery mode manager 130 may determine the recovery mode RM by using the reference step. In some example embodiments in which the reference step is the third step Step3, the recovery mode manager 130 may receive information on the second step Step2, which is a step corresponding to the supply voltage level, from the control logic 120 at the first timing t1. Since the second step Step2 is before the third step Step3 or the reference step, the recovery mode manager 130 may output the cancel mode CM as the recovery mode RM to the control logic 120. On the other hand, the recovery mode manager 130 may receive information on the third step Step3, which is a step corresponding to the supply voltage level, from the control logic 120 at the second timing t2. Since the third step Step3 is not before the reference step or the third step Step3, the recovery mode manager 130 may output the loop mode LM as the recovery mode RM to the control logic 120.

Figure 13A:
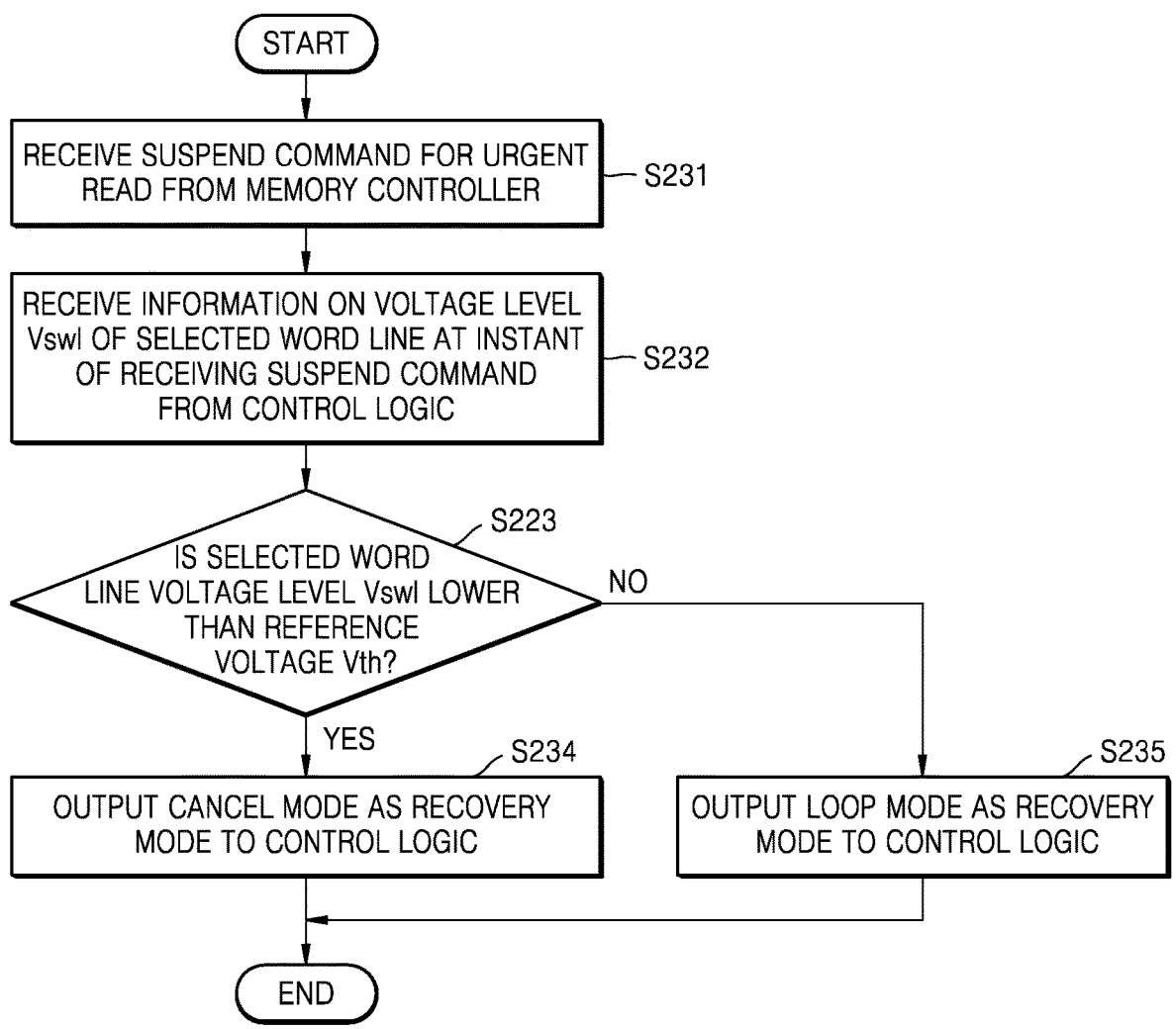
FIG. 13A is a flowchart showing an operation of a recovery mode manager determining a recovery mode using a word line voltage level determiner according to some example embodiments.

FIG. 13A is a flowchart showing an operation of the recovery mode manager 130 according to some example embodiments. In detail, FIG. 13A shows some example embodiments in which the recovery mode manager 130 determines the recovery mode RM by using the word line voltage level determiner 133.

Referring to FIGS. 2 and 13A, the recovery mode manager 130 may receive the suspend command CMD_spd for the urgent read from the memory controller (20 in FIG. 1) (S231). The recovery mode manager 130 may receive information on the voltage level Vswl of the selected word line upon receiving the suspend command CMD_spd from the control logic 120 or the memory cell array 110 (S232). The recovery mode manager 130 may compare the selected word line voltage level Vswl with the reference voltage Vth (S233). When the selected word line voltage level Vswl is lower than the reference voltage Vth, the recovery mode manager 130 may output the cancel mode CM as the recovery mode RM to the control logic 120 (S234). Otherwise, when the selected word line voltage level Vswl is not lower than the reference voltage Vth, the recovery mode manager 130 may output the loop mode LM as the recovery mode RM to the control logic 120 (S235).

Figure 13B:
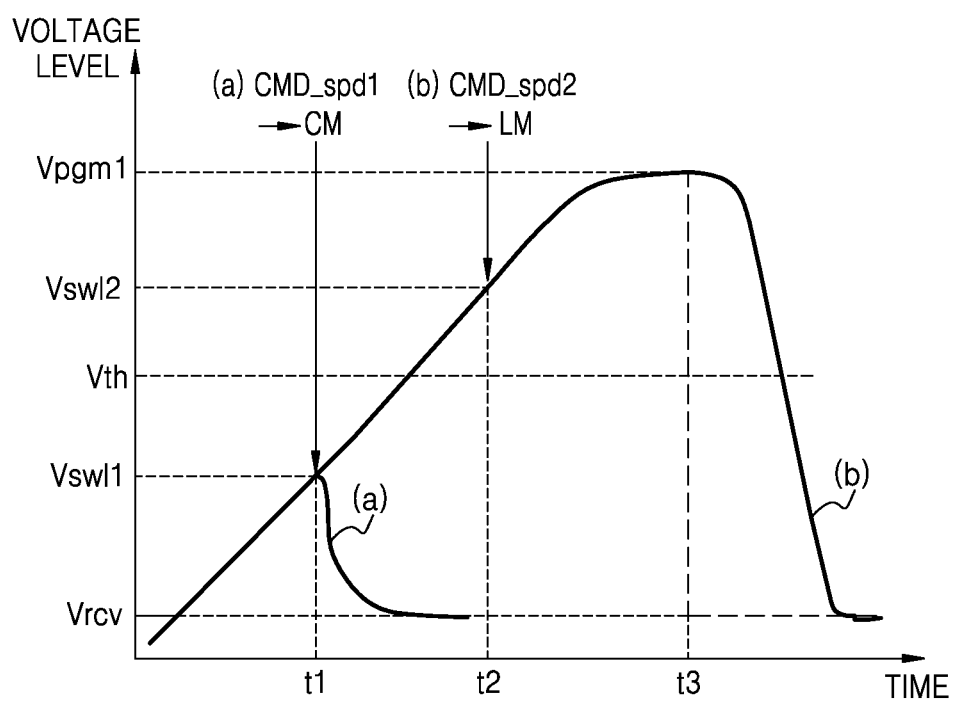
FIG. 13B is a graph showing voltage levels of selected word lines during an operation of a recovery mode manager determining a recovery mode using a word line voltage level determiner according to some example embodiments.

FIG. 13B is a graph showing voltage levels of selected word lines during an operation of the recovery mode manager 130 according to some example embodiments. In detail, FIG. 13B shows some example embodiments in which the recovery mode manager 130 determines the recovery mode RM by using the word line voltage level determiner 133.

Referring to FIGS. 2, 13A, and 13B, in the example (a), the recovery mode manager 130 may receive the first suspend command CMD_spd1 at the timing t1 while the nonvolatile memory device 10 performs the first program loop Program Loop1. Since a first selected word line voltage level Vswl1 is lower than the reference voltage Vth at the first timing t1, the recovery mode manager 130 may output the cancel mode CM as the recovery mode RM to the control logic 120. The control logic 120 may immediately, or contemporaneously, perform the recovery operation by lowering the voltage level of the selected word line to the recovery voltage Vrcv in response to the received CM. Although not shown, after completion of the recovery operation, the nonvolatile memory device 10 may perform the urgent read operation. In addition, after completion of the urgent read operation, the nonvolatile memory device 10 may again perform the first program loop Program Loop 1 in response to the resume command CMD_rsm.

In the example (b), the recovery mode manager 130 may receive the second suspend command CMD_spd2 at the second timing t2 while the nonvolatile memory device 10 performs the first program loop Program Loop 1. Since a second selected word line voltage level Vswl2 is not lower than the reference voltage Vth at the second timing t2, the recovery mode manager 130 may output the loop mode LM as the recovery mode RM to the control logic 120. The control logic 120 may complete the first program loop Program Loop 1 by increasing the voltage level of the selected word line to the first program voltage Vpgm1, without immediately, or contemporaneously, performing the recovery operation in response to the received LM. The nonvolatile memory device 10 may perform the recovery operation at the third timing t3 at which the first program loop Program Loop 1 is complete. Although not shown, after completion of the recovery operation, the nonvolatile memory device 10 may perform the urgent read operation. In addition, after completion of the urgent read operation, the nonvolatile memory device 10 may perform the second program loop Program Loop 2 which is a sequence following the first program loop Program Loop 1 in response to the resume command CMD_rsm.

Figure 14A:
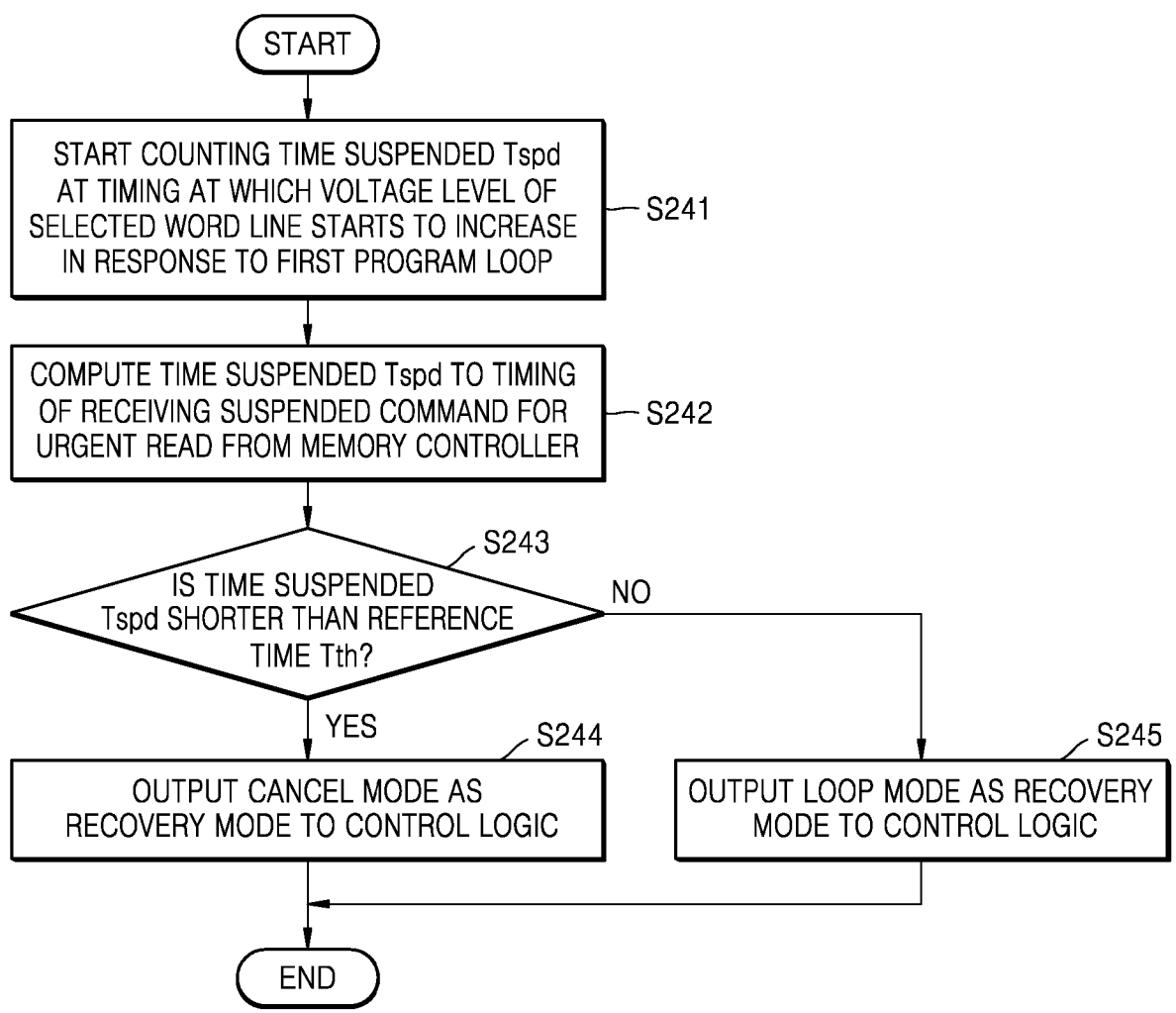
FIG. 14A is a flowchart showing an operation of a recovery mode manager determining a recovery mode using a time suspending counter according to some example embodiments.

FIG. 14A is a flowchart showing an operation of the recovery mode manager 130 according to some example embodiments. In detail, FIG. 14A shows some example embodiments in which the recovery mode manager 130 determines the recovery mode RM by using the time suspended counter 134.

Referring to FIG. 2 and FIG. 14A, the recovery mode manager 130 may start counting the time suspended Tspd at a timing at which the voltage level of the selected word line starts to increase in response to the first program loop Program Loop 1 (S241). The recovery mode manager 130 may receive the suspend command CMD_spd for the urgent read from the memory controller (20 in FIG. 1) and compute the time suspended from a timing at which the voltage level of the selected word line increases to the timing of receiving the suspended command CMD_spd (S242). The recovery mode manager 130 may compare the time suspended Tspd with the reference time Tth (S243). When the time suspended Tspd is shorter than the reference time Tth, the recovery mode manager 130 may output the cancel mode CM as the recovery mode RM to the control logic 120 (S244). When the time suspended Tspd is not shorter than the reference time Tth, the recovery mode manager 130 may output the loop mode LM as the recovery mode RM to the control logic 120 (S245).

Figure 14B:
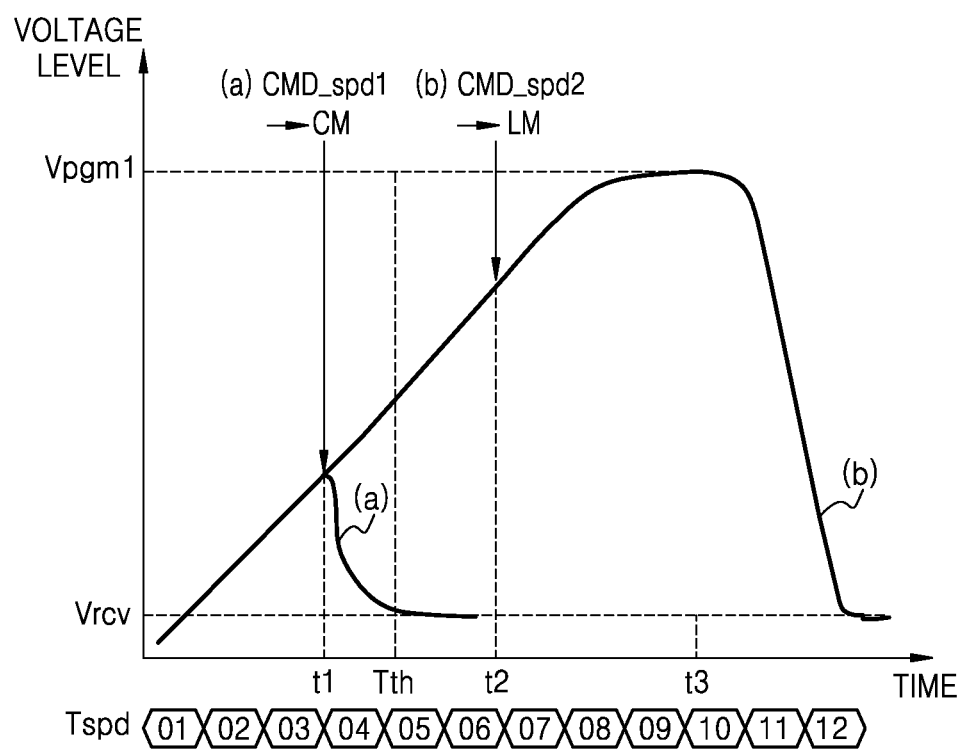
FIG. 14B is a graph showing voltage levels of selected word lines during an operation of a recovery mode manager determining a recovery mode using a time suspending counter according to some example embodiments.

FIG. 14B is a graph illustrating voltage levels of selected word lines during a sequence of operations of the recovery mode manager 130 according to some example embodiments. In detail, FIG. 14B shows some example embodiments in which the recovery mode manager 130 determines the recovery mode RM by using the time suspended counter 134. In addition, FIG. 14B shows some example embodiments in which the reference time Tth is '04'.

Referring to FIGS. 2, 14A and 14B, the recovery mode manager 130 may start counting the time suspended Tspd from a timing at which the voltage level of the selected word line starts to increase. In the example (a), the recovery mode manager 130 may receive the first suspend command CMD_spd1 at the first timing t1 while the nonvolatile memory device 10 performs the first program loop Program Loop 1. The recovery mode manager 130 may generate the time suspended Tspd as '03' at the first timing t1, and since the generated time suspended Tspd is less than the reference time Tth or '04', the recovery mode manager 130 may output the cancel mode CM as the recovery mode RM to the control logic 120. The control logic 120 may immediately, or contemporaneously, perform the recovery operation by lowering the voltage level of the selected word line to the recovery voltage Vrcv in response to the received CM.

Although not shown, after completion of the recovery operation, the nonvolatile memory device 10 may perform the urgent read operation. In addition, after completion of the urgent read operation, the nonvolatile memory device 10 may again perform the first program loop Program Loop 1 in response to the resume command CMD_rsm.

In the example (b), the recovery mode manager 130 may receive the second suspend command CMD_spd2 at the second timing t2 while the nonvolatile memory device 10 performs the first program loop Program Loop 1. The recovery mode manager 130 may generate the time suspended Tspd as '06' at the second timing t2, and since the generated time suspended Tspd is not less than the reference time Tth or '04', the recovery mode manager 130 may output the loop mode LM as the recovery mode RM to the control logic 120. The control logic 120 may complete the first program loop Program Loop 1 by increasing the voltage level of the selected word line to the first program voltage Vpgm1, without immediately, or contemporaneously, performing the recovery operation in response to the received LM. The nonvolatile memory device 10 may perform the recovery operation at the third timing t3 at which the first program loop Program Loop 1 is complete. Although not shown, after completion of the recovery operation, the nonvolatile memory device 10 may perform the urgent read operation. In addition, after completion of the urgent read operation, the nonvolatile memory device 10 may perform the second program loop Program Loop 2, which is a sequence following the first program loop Program Loop 1, in response to the resume command CMD_rsm.

Figure 15:
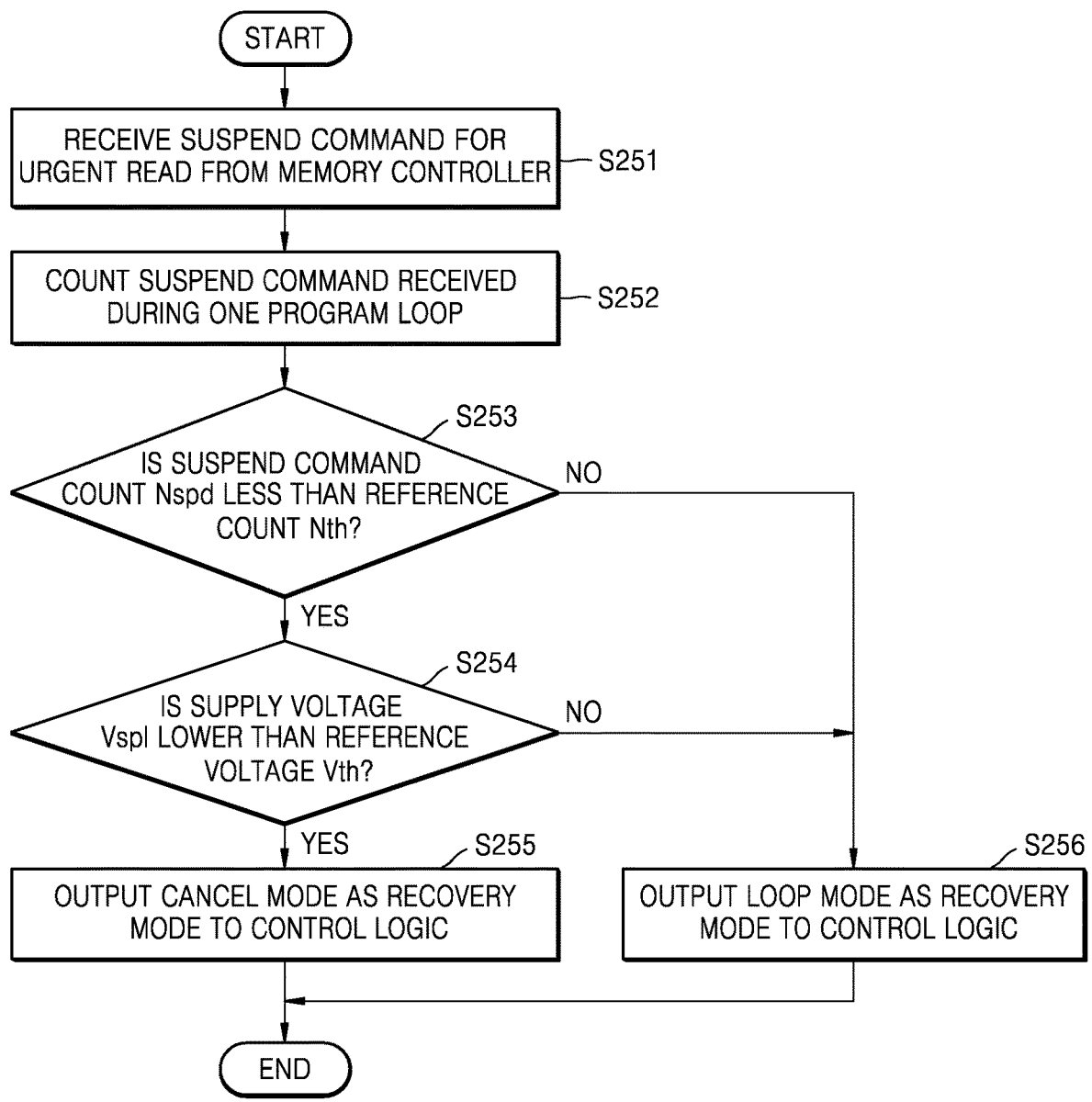
FIG. 15 is a flowchart showing an operation of a recovery mode manager determining a recovery mode using two or more of a suspend command counter, a supply voltage determiner, and a word line voltage level determiner according to some example embodiments.

FIG. 15 is a flowchart showing an operation of the recovery mode manager 130 according to some example embodiments.

Referring to FIGS. 2, 10, and 15, the recovery mode manager 130 may determine the recovery mode RM by using conditions of two or more of the suspend command counter 131, the supply voltage determiner 132, and the word line voltage level determiner 133.

The recovery mode manager 130 may receive the suspend command CMD_spd for the urgent read from the memory controller (20 in FIG. 1) (S251). The recovery mode manager 130 may generate the suspend command count Nspd by counting the suspend commands CMD_spd received during the first program loop Program Loop 1 among the plurality of program loops Program Loop 1 through Program Loop n (S252). The recovery mode manager 130 may compare the suspend command count Nspd with the reference count Nth (S253). When the suspend command count Nspd is not less than the reference count Nth, the recovery mode manager 130 may output the loop mode LM as the recovery mode RM to the control logic 120 (S256). Otherwise, when the suspend command Nspd is less than the reference count Nth, the recovery mode manager 130 may compare the supply voltage Vsp1 received from the control logic 120 with the reference voltage Vth (S254). When the supply voltage Vsp1 is lower than the reference voltage Vth, the recovery mode manager 130 may output the cancel mode CM as the recovery mode RM to the control logic 120 (S255). When the supply voltage Vsp1 is not lower than the reference voltage Vth, the recovery mode manager 130 may output the loop mode LM as the recovery mode RM to the control logic 120 (S256).

FIG. 15 shows some example embodiments in which the recovery mode manager 130 determines the recovery mode RM by using the suspend command counter 131 and the supply voltage determiner 132, but some example embodiments are not limited thereto. It should be understood that in some example embodiments the recovery mode RM is determined by using two or more different conditions.

Figure 16:
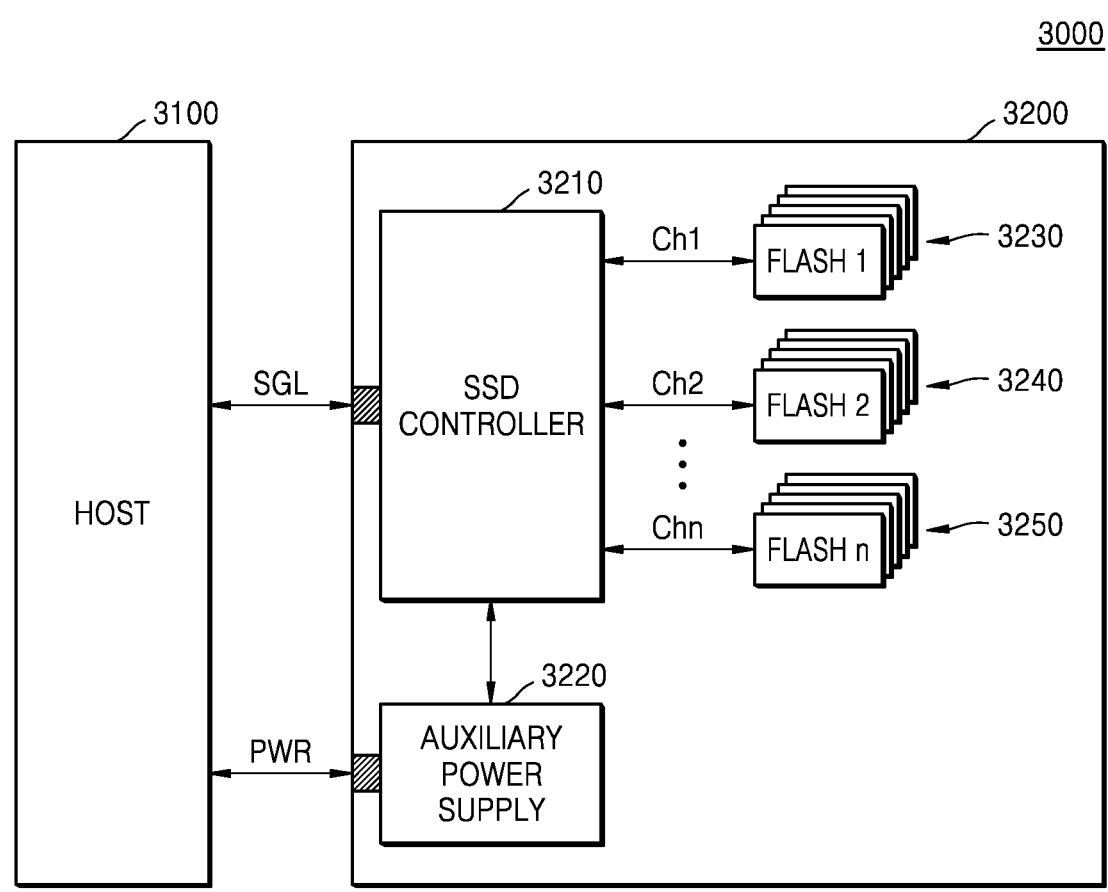
FIG. 16 is a block diagram of an example in which a nonvolatile memory device is applied to a solid state drive (SSD) system, according to some example embodiments.

FIG. 16 is a block diagram of an example in which a nonvolatile memory device is applied to a solid state drive (SSD) system 1000, according to some example embodiments.

Referring to FIG. 16, the SSD system 1000 may include a host HOST 1100 and a SSD 1200. The SSD 1200 may exchange signals SGL with the host HOST 1100 via a signal connector and receive power PWR via a power connector. The SSD 1200 may include an SSD controller 1210, an auxiliary power supply 1220, and flash memory devices 1230, 1240, and 1250. The SSD 1200 may communicate with the flash memory devices 1230, 1240, and 1250 over corresponding communication channels Ch1 through Chn. In this case, the SSD 1200 may be realized by using some example embodiments illustrated in FIGS. 1 through 15.

In detail, the nonvolatile memory device 10 in FIG. 2 may be applied to at least one of the flash memory devices 1230, 1240, and 1250. Accordingly, when the suspend command CMD_spd for the urgent read is received during a program operation, at least one of the flash memory devices 1230, 1240, and 1250 may determine the recovery mode RM based on the suspend command CMD_spd and perform the recovery operations at different timings depending on the determined RMs. Thus, the write starvation in which the program request is delayed may be mitigated or prevented and the efficient urgent read operation may be performed.

A nonvolatile memory device according to some example embodiments may be applied not only to the SSD 1200 but also to a memory card system, a computing system, a universal flash storage (UFS), etc. In addition, the operation method of the nonvolatile memory device according to some example embodiments may be applied to various electronic systems including nonvolatile memories.

While some example embodiments have been particularly shown and described, it will be understood by one of ordinary skill in the art that various changes in form and details may be made therein without departing from the spirit and scope of some example embodiments as defined by the following claims.

What is claimed is:

1. A method performed by a nonvolatile memory device, the method comprising:
    initiating a first program operation corresponding to a first program loop among a plurality of program loops;
    receiving a suspend command for an urgent read operation during the first program operation;
    determining a recovery timing from among a first timing or a second timing based on the suspend command and at least one of a suspended time count or a suspend command quantity, the first timing being contemporaneous with the receiving the suspend command, the second timing being after completion of the first program operation, the suspended time count being an amount of time between a first time at which a voltage of a selected word line starts to increase and a second time at which the suspend command is received, and the suspend command quantity being a quantity of suspend commands received while the first program operation is performed; and
    initiating a recovery at the recovery timing by applying a recovery voltage to the selected word line.

2. The method of claim 1, further comprising:
    performing the urgent read operation after completing the recovery;

receiving a resume command for performing a program operation; and initiating a program operation in response to the receiving the resume command.

3. The method of claim 2, wherein the initiating the program operation includes re-initiating the first program operation when the recovery timing is the first timing.

4. The method of claim 2, wherein the initiating the program operation includes initiating a second program operation corresponding to a second program loop among the plurality of program loops when the recovery timing is the second timing, the second program loop corresponding to a next loop following the first program loop.

5. The method of claim 1, wherein the first program operation includes sequentially applying a plurality of stepwise increasing supply voltages to the selected word line, the plurality of stepwise increasing supply voltages including a reference supply voltage; and the determining the recovery timing determines the recovery timing based on, the at least one of the suspended time count or the suspend command quantity, and a determination of whether the suspend command is received before the reference supply voltage is applied.

6. The method of claim 1, wherein the first program operation includes increasing the voltage of the selected word line.

7. The method of claim 6, wherein the determining the recovery timing determines the recovery timing based on, the at least one of the suspended time count or the suspend command quantity, and a determination of whether the voltage of the selected word line is less than a reference voltage when the suspend command is received.

8. The method of claim 6, further comprising determining the suspended time count by determining the amount of time between the first time and the second time.

9. The method of claim 8, wherein the determining the recovery timing determines the recovery timing based on the suspended time count by, determining the recovery timing as the first timing in response to the suspended time count being less than a reference time, and determining the recovery timing as the second timing in response to the suspended time count being equal to or greater than the reference time.

10. The method of claim 1, further comprising counting the suspend command quantity.

11. The method of claim 10, wherein the determining the recovery timing includes determining the recovery timing as the second timing in response to the suspend command quantity being equal to or greater than a reference count.

12. The method of claim 11, wherein the first program operation includes sequentially applying a plurality of stepwise increasing supply voltages including a reference supply voltage; and the determining the recovery timing further includes determining the recovery timing as the first timing in response to the suspend command quantity being less than the reference count and the suspend command being received before the reference supply voltage is applied, and determining the recovery timing as the second timing in response to the suspend command quantity being less than the reference count and the suspend command being received after the reference supply voltage is applied.

13. The method of claim 1, further comprising outputting a ready signal after the recovery is complete.

14. A method performed by a nonvolatile memory device, the method comprising:

increasing a voltage level of a selected word line by sequentially applying a plurality of stepwise increasing supply voltages to the selected word line corresponding to a program command;

receiving a suspend command for an urgent read operation during the increasing a voltage level of a selected word line;

determining a recovery mode based on the suspend command and at least one of a suspended time count or a suspend command quantity, the suspended time count being an amount of time between a first time at which the voltage level of the selected word line starts to increase and a second time at which the suspend command is received, and the suspend command quantity being a quantity of suspend commands received while the increasing a voltage level of a selected word line is performed;

performing a recovery according to the recovery mode; and performing the urgent read operation in response to a read command, wherein the recovery mode is either of a cancel mode in which the recovery is performed contemporaneous with the receiving the suspend command or a loop mode in which the recovery is performed after increasing the voltage level of the selected word line to a target voltage.

15. The method of claim 14, wherein the determining the recovery mode determines the recovery mode based on:

the at least one of the suspended time count or the suspend command quantity, and a determination of whether the suspend command is received before a reference supply voltage of the plurality of stepwise increasing supply voltages is applied.

16. The method of claim 14, further comprising:

counting the suspend command quantity, wherein the determining the recovery mode further includes, determining the recovery mode to be the loop mode in response to the suspend command quantity being equal to or greater than a reference count, or the suspend command quantity being less than the reference count and the suspend command being received after a reference supply voltage of the plurality of stepwise increasing supply voltages is applied, and determining the recovery mode to be the cancel mode in response to the suspend command quantity being less than the reference count and the suspend command being received before the reference supply voltage is applied.

17. A nonvolatile memory device comprising:

at least one processor configured to execute computer-readable instructions stored in non-transitory computer readable storage to apply a program voltage to a selected word line for increasing a voltage level of the selected word line to perform a program operation in response to a program command, apply a recovery voltage to the selected word line according to a recovery mode in response to receiving a suspend command for an urgent read operation during the program operation, and determine the recovery mode based on the suspend command and at least one of a suspended time count or a suspend command quantity, the suspended time count being an amount of time between a first time at which the voltage level of a selected word line starts to increase and a second time at which the suspend command is received, and the suspend command quantity being a quantity of suspend commands received while the program operation is performed, wherein the recovery mode is either of a cancel mode in which the recovery voltage is applied before a first program loop corresponding to the program command is complete or a loop mode in which the recovery voltage is applied after the first program loop is complete.

18. The nonvolatile memory device of claim 17, wherein the at least one processor is configured to determine the recovery mode based on the suspend command and the suspend command quantity.

19. The nonvolatile memory device of claim 17, wherein the at least one processor is further configured to:

sequentially apply a plurality of increasing program voltages to the selected word line; and determine the recovery mode based on,
the at least one of the suspended time count or the suspend command quantity, and a determination of whether the suspend command is received before a reference supply voltage of a plurality of stepwise increasing supply voltages is applied to the selected word line.

20. The nonvolatile memory device of claim 17, wherein the at least one processor is further configured to:

determine the suspend command quantity;

sequentially apply a plurality of increasing program voltages to the selected word line;

determine the recovery mode to be the loop mode in response to,
the suspend command quantity being equal to or greater than a reference count, or
the suspend command quantity being less than the reference count and the suspend command being received after a reference supply voltage of a plurality of stepwise increasing supply voltages is applied to the selected word line; and determine the recovery mode to be the cancel mode in response to the suspend command quantity being less than the reference count and the suspend command being received before the reference supply voltage is applied.

* * * * *